United States Patent
Kao et al.

(10) Patent No.: US 11,895,825 B2
(45) Date of Patent: Feb. 6, 2024

(54) SEMICONDUCTOR DEVICE INCLUDING INTEGRATED CAPACITOR AND VERTICAL CHANNEL TRANSISTOR AND METHODS OF FORMING THE SAME

(71) Applicant: Taiwan Semiconductor Manufacturing Company Limited, Hsinchu (TW)

(72) Inventors: Yun-Feng Kao, Hsinchu (TW); Katherine H. Chiang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 139 days.

(21) Appl. No.: 17/483,859

(22) Filed: Sep. 24, 2021

(65) Prior Publication Data
US 2022/0359529 A1    Nov. 10, 2022

Related U.S. Application Data

(60) Provisional application No. 63/185,374, filed on May 7, 2021.

(51) Int. Cl.
*H10B 12/00* (2023.01)

(52) U.S. Cl.
CPC ........... *H10B 12/37* (2023.02); *H10B 12/038* (2023.02); *H10B 12/34* (2023.02); *H10B 12/48* (2023.02)

(58) Field of Classification Search
CPC ...... H10B 12/37; H10B 12/038; H10B 12/34; H10B 12/48; H10B 12/0383; H10B 12/033; H10B 12/053; H10B 12/377; H10B 12/482; H01L 28/86; H01L 28/90
See application file for complete search history.

(56) References Cited

U.S. PATENT DOCUMENTS

| | | | |
|---|---|---|---|
| 2013/0146958 A1* | 6/2013 | Kim | H10B 12/488 257/E29.345 |
| 2014/0159197 A1* | 6/2014 | Weng | H01L 28/92 257/532 |
| 2017/0133384 A1* | 5/2017 | Hsu | H10B 12/315 |
| 2019/0108943 A1* | 4/2019 | Liu | H01G 4/18 |
| 2020/0098855 A1* | 3/2020 | Kuo | H01L 28/91 |
| 2020/0335504 A1* | 10/2020 | Sugioka | H01L 28/86 |
| 2021/0082715 A1* | 3/2021 | Rubloff | H01M 4/0423 |
| 2021/0098566 A1* | 4/2021 | Chern | H10B 12/0387 |
| 2022/0285480 A1* | 9/2022 | Kalnitsky | H01L 23/5223 |
| 2022/0359529 A1* | 11/2022 | Kao | H01L 28/86 |
| 2023/0009575 A1* | 1/2023 | Cho | H01L 29/7869 |
| 2023/0100252 A1* | 3/2023 | Fukae | H01L 27/0676 257/534 |

* cited by examiner

*Primary Examiner* — Edward Chin
(74) *Attorney, Agent, or Firm* — The Marbury Law Group, PLLC

(57) ABSTRACT

A semiconductor device includes an insulating base including a trench, a transistor including a gate electrode and vertical channel in the trench, and a source electrode in the insulating base outside the trench, an isolation layer on the gate electrode in the trench, and a capacitor including a trench capacitor portion that is on the isolation layer in the trench, and a stacked capacitor portion that is coupled to the source electrode of the transistor outside the trench.

18 Claims, 21 Drawing Sheets

SEMICONDUCTOR DEVICE INCLUDING INTEGRATED CAPACITOR AND VERTICAL CHANNEL TRANSISTOR AND METHODS OF FORMING THE SAME

RELATED APPLICATIONS

This application claims the benefit of priority from U.S. Provisional Application No. 63/185,374, entitled "A Hybrid Stacked-Trench Capacitor Integrated with Vertical Channel Thin Film Transistor for BEOL DRAM Memory Array," filed on May 7, 2021, the entire contents of which are incorporated herein by reference for all purposes.

BACKGROUND

Semiconductor devices that utilize on-chip capacitors include, for example, dynamic random access memories (DRAMs), voltage controlled oscillators (VCOs), phase-locked loops (PLL), operational amplifiers (OP-AMPS), and switching (or switched) capacitors (SCs). Such on-chip capacitors may also be usable to decouple digital and analog integrated circuits (ICs) from electrical noise generated in or transmitted by other components of a semiconductor device.

Capacitor structures for ICs have evolved from the initial parallel plate capacitor structures, having two conductive layers separated by a dielectric, to more complex capacitor designs that may meet specifications for high capacitance in increasingly smaller devices. These more complex designs include, for example, metal-oxide-metal (MOM) capacitor designs and interdigitated finger MOM capacitor structures. Capacitors utilized in DRAM devices, for example, may include stacked capacitors above a substrate or trench capacitors where conductive material extends across a surface of the substrate and/or into multiple trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
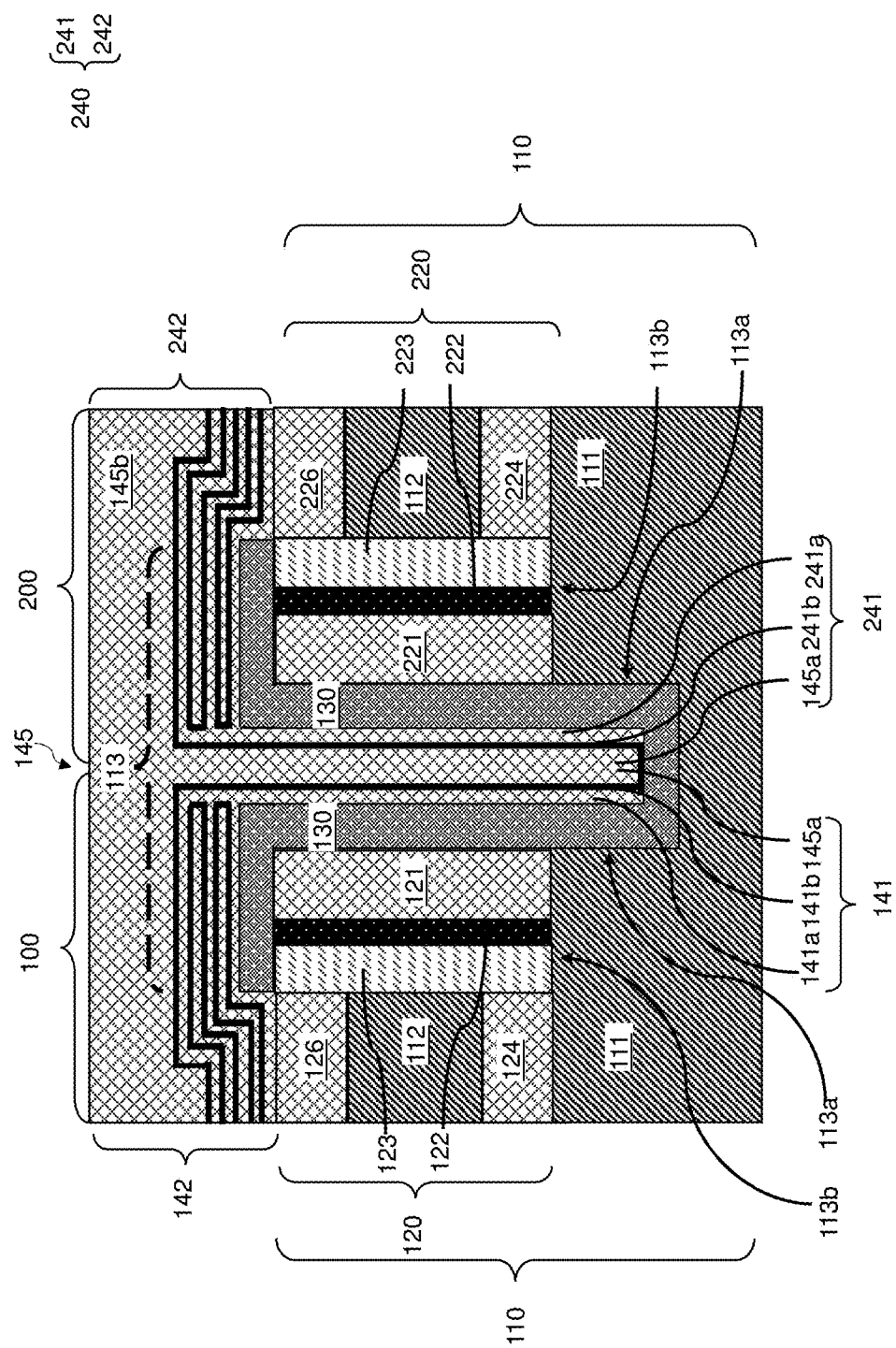
FIG. 1A illustrates a first semiconductor device (e.g., first memory cell) and a second semiconductor device (e.g., second memory cell) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A typical DRAM device may include arrays of memory cells that may each comprise a charge storage device (e.g., a capacitor) coupled to a charge accessing device (e.g., an MOS field effect transistor (MOSFET)). Such devices may be referred to as a 1T1C device (one transistor, one capacitor device). The source electrode of the transistor may be connected to one plate of the storage capacitor. The drain electrode of the transistor may be connected to a conducting bit line. The gate electrode of the transistor may be connected to a conducting word line.

In operation, a logical 1 or a 0 may be written into or read out of the memory cell of the DRAM device. In order to access or select a specific memory cell, the intersecting word line and bit line for the transistor associated with the specified memory cell may be energized to write in or read out the value stored on the capacitor coupled to the access/select transistor. In a write operation, by applying a given potential to the word line turns on the access transistor and a given charge applied to the bit line will then be deposited on the capacitor plate and stored. Conversely, during a read operation, the word line again activates the access transistor and the presence of the charge in the capacitor may be sensed by appropriate circuitry and identified as a 1 or 0.

Some DRAM devices may utilize a planar-type storage capacitor. However, such DRAM devices that utilize a planar-type storage capacitor may occupy a large wafer surface area. Other DRAM devices may use a stacked capacitor to achieve higher capacitance with a reduced size. The stacked capacitor may be formed on top of the transistor which allows a smaller cell to be built without losing storage capacity.

Still other DRAM devices may use a trench capacitor to achieve higher capacitance with a reduced size. The trench capacitor may be formed in a trench or cavity that extends vertically into the substrate of an integrated circuit, and may be formed through a variety of etching processes. Such trench capacitors may increase plate area and, hence, capacitance, through an increased vertical extension rather than by horizontal extension of the metal plate surface. A first plate of such a trench capacitor may be defined by the surface of the inner wall of the doped region of the substrate within which the trench may be formed. Although such an inner wall forms the plate boundary, charge may also be stored within a depletion region formed beneath the wall surface and extending into the doped substrate. The opposing second plate of the trench capacitor, which may also be a storage plate, may be a conductive core that may be formed within the trench. An oxide layer may first be formed over the inner trench wall to serve as a dielectric medium and to insulate the first plate from the second plate.

Various embodiments disclosed herein may provide a hybrid stacked-trench (ST) capacitor. A ST capacitor may include elements of both a stacked capacitor and a trench capacitor. The hybrid ST capacitor may also be integrated with a vertical channel transistor, such as a vertical channel, thin-film transistor (TFT) for a DRAM memory cell. Transistors that utilize metal oxide semiconductor materials to form an active channel, such as TFT, may be formed at lower temperatures. Such transistors may be ideally suited for a back end of line (BEOL) DRAM memory array as the fabrication of such transistors may not damage other devices previously formed in a front end of line (FEOL) and/or middle end of the line (MEOL) process.

A three-dimensional DRAM cell (e.g., 3D DRAM) structure may provide a number of additional advantages. To reduce the frequency of refreshing data, a large capacitor may be necessary for a DRAM cell that includes one transistor and one capacitor (e.g., 1T1C DRAM). Both stacked capacitors and trench capacitors may be used to fabricate a large capacitor. The hybrid stacked-trench (ST) capacitor of the present invention may effectively obtain a large capacitor (e.g., greater than about 1.5 fF) within a small area (e.g., less than about 80 nm×80 nm) and thin interlayer dielectric (ILD) thickness (e.g., less than about 200 nm) in the BEOL DRAM memory array. Further, an even greater capacitance per unit area may be obtained by increasing a thickness of an insulating base (e.g., interlayer dielectric (ILD)).

The structure of the hybrid ST capacitor may effectively utilize the height of a vertical channel transistor, such as a vertical channel TFT, to construct the capacitor. The structure may provide good flexibility during the fabrication of the hybrid ST capacitor. Further, a capacity of the hybrid ST capacitor may be freely regulated by controlling the depth of trench and/or a characteristic (e.g., number, thickness, length, area, etc.) of layers (e.g., stacked fins) outside the trench. The vertical channel transistor is not restricted to just this structure, but can be substituted by another architecture having a channel in the vertical direction.

Referring to the drawings, FIG. 1A illustrates a vertical cross-sectional view of a first semiconductor device 100 (e.g., first memory cell) according to one or more embodiments. The first semiconductor device 100 may include, for example, an integrated capacitor and transistor for a 1-transistor/1-capacitor (1T1C) DRAM cell. As illustrated in FIG. 1A, the first semiconductor device 100 may include an insulating base 110 that in turn may include a lower insulating layer 111 and an upper insulating layer 112. The insulating base 110 may include, for example, interlayer dielectric (ILD), and may be formed of a dielectric material such as silicon dioxide ($SiO_2$). Other suitable dielectric materials are within the contemplated scope of disclosure.

A trench 113 may be formed in the insulating base 110 so as to extend in the Z-direction in FIG. 1A. The trench 113 may have one or more portions with different depths including an inner trench portion 113a having a first depth and a bottom that may be located in the lower insulating layer 111, and an outer trench portion 113b having a bottom that may also be located in the lower insulating layer 111 but with a second depth that may be less than the first depth.

The first semiconductor device 100 may also include a first transistor 120. The first transistor 120 may include a first gate electrode 121 that may be formed in the outer trench portion 113b. The first gate electrode 121 may include, for example, of TiN or TaN. Other suitable conductive materials for use as the first gate electrode 121 are within the contemplated scope of disclosure. The first transistor 120 may also include a first gate dielectric 122 formed on a side of the first gate electrode 121 in the outer trench portion 113b. The first gate dielectric 122 may include, for example, $SiO_2$, $Al_2O_3$ $HfO_2$, $TiO_2$ or $ZrO_2$. Other suitable dielectric materials are within the contemplated scope of disclosure.

The first transistor 120 may further include a first vertical channel 123 formed in the outer trench portion 113b. The first vertical channel 123 may be on a side of the first gate dielectric 122, and may be formed from, for example, a semiconducting material such as one or more of InZnO (IZO), indium tin oxide (ITO), $In_2O_3$, $Ga_2O_3$, InGaZnO, ZnO, $Al_2O_5Zn_2$ aluminum-doped ZnO (AZO), IWO, $TiO_x$. The first vertical channel 123 may also include, for example, semiconductor materials including other Group III-V materials, and combinations (e.g., alloys or stacked layers) of such semiconductor materials. Other suitable semiconducting materials are within the contemplated scope of disclosure.

Figure 1B:
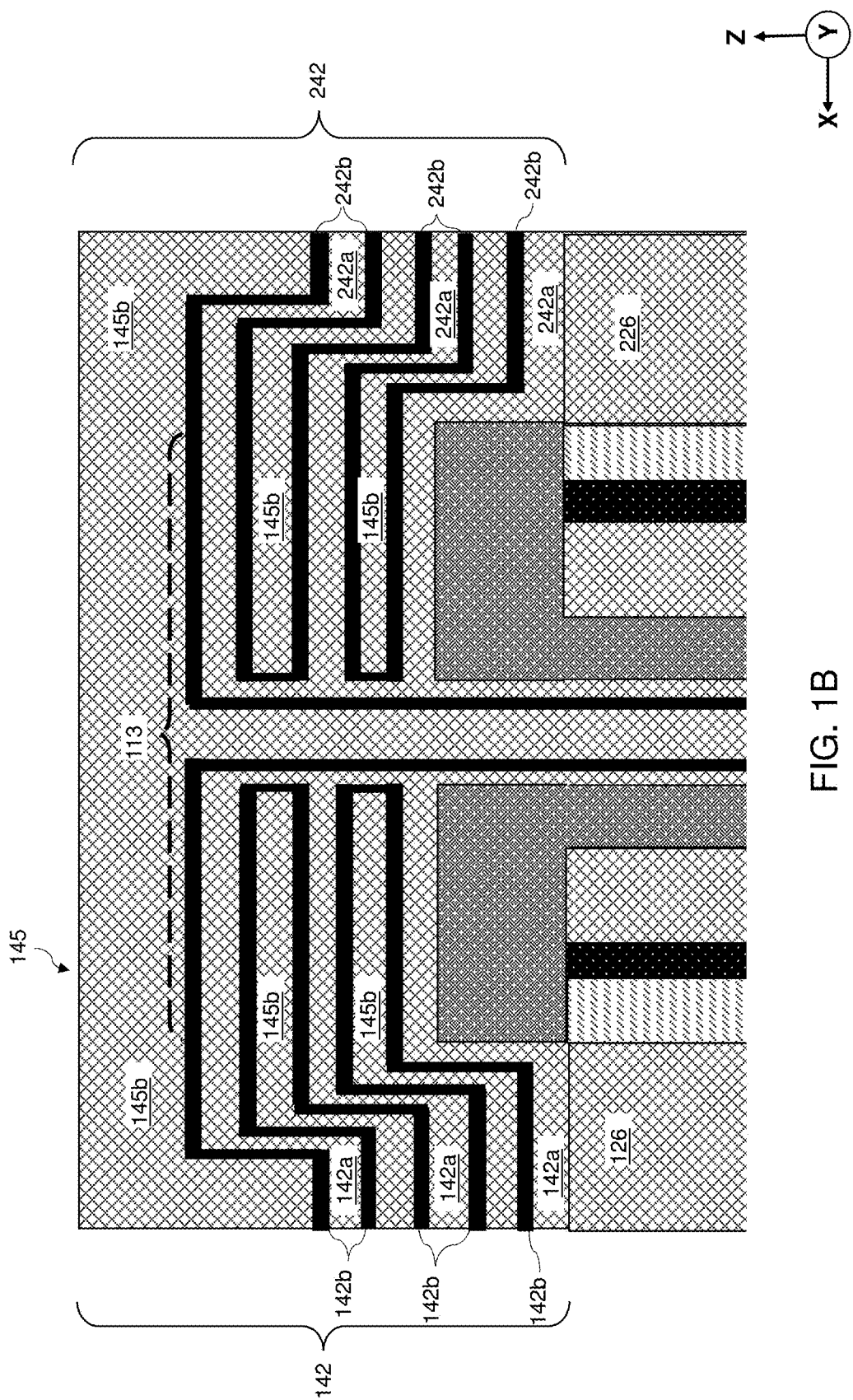
FIG. 1B provides a detailed illustration of a first stacked capacitor portion in the first semiconductor device and a second stacked capacitor portion in the second semiconductor device according to one or more embodiments.
Figure 1C:
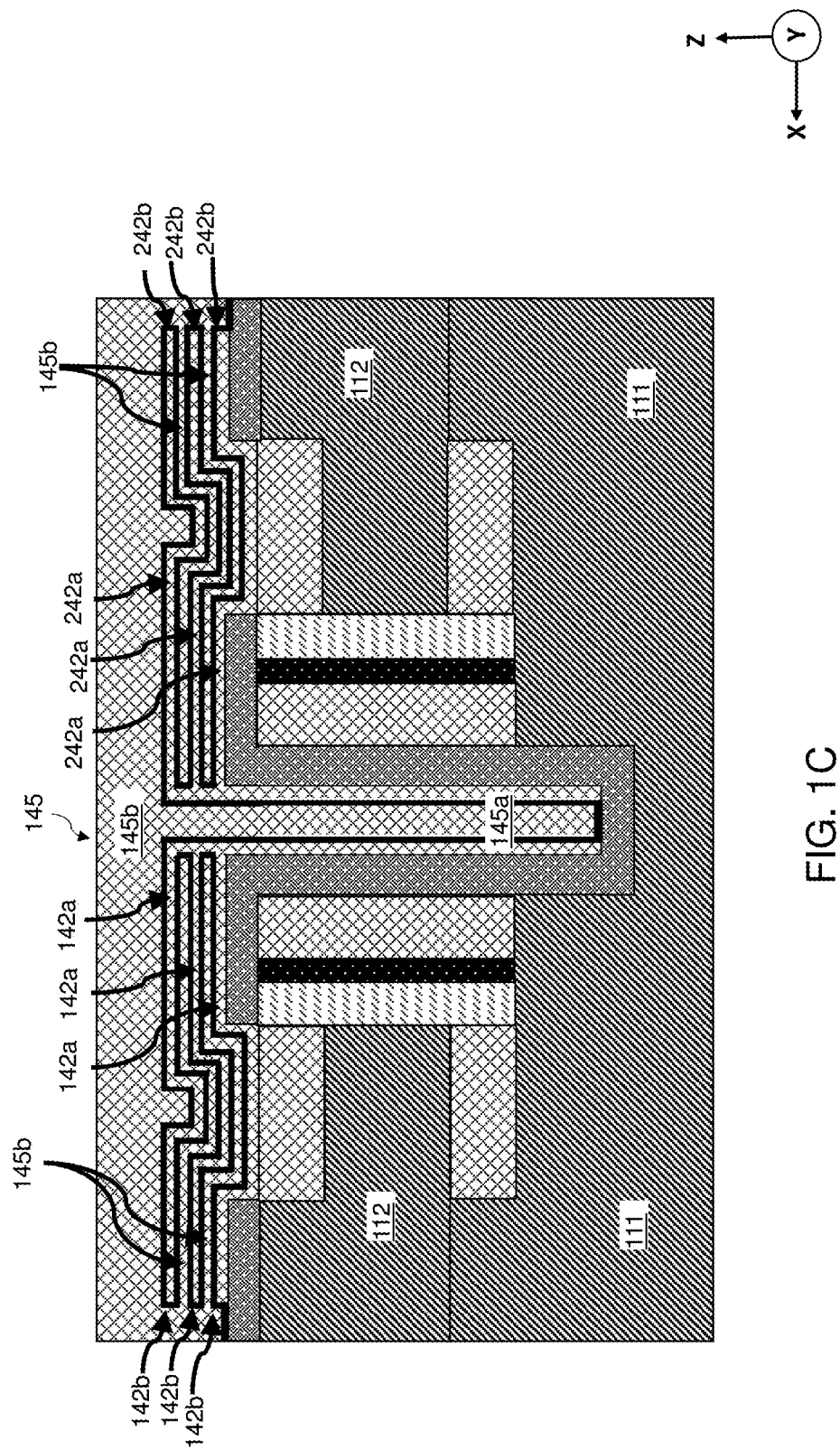
FIG. 1C provides a detailed illustration of a top electrode in the first semiconductor device and the second semiconductor device according to one or more embodiments.

The first transistor 120 may also include a first drain electrode 124 that may be formed in the lower insulating layer 111 (as shown in FIG. 1C), and a first source electrode 126 that may be formed in the upper insulating layer 112 (as shown in FIG. 1C). The first drain electrode 124 and first source electrode 126 may contact the first vertical channel 123 and be separated in the Z-direction by the upper insulating layer 112. Each of the first drain electrode 124 and the first source electrode 126 may include, for example, of TiN or TaN. Other suitable conductive materials for use as the first drain electrode 124 and the first source electrode 126 are within the contemplated scope of disclosure.

An isolation layer 130 may be formed over the first gate electrode 121 (e.g., a lateral surface of the first gate electrode 121) in the trench 113. The isolation layer 130 may extend into the inner trench portion 113a and on a bottom of the inner trench portion 113a. The isolation layer 130 may include, for example, $AlO_x$, or any other electrically insulating material with a high selectivity to sacrificial oxide (e.g., silicon oxide, silicon nitride). Other suitable insulating materials are within the contemplated scope of disclosure.

The first semiconductor device 100 may also include a first capacitor 140. The first capacitor 140 may include, for example, a hybrid stacked-trench capacitor having a first trench capacitor portion 141 that may be formed in the trench 113 and a first stacked capacitor portion 142 that may be formed outside the trench 113.

The first capacitor 140 may also include a top electrode 145 that may serve, for example, as a ground electrode for both the first trench capacitor portion 141 and the first stacked capacitor portion 142. The top electrode 145 may include a lower top electrode portion 145a in the first trench capacitor portion 141, and an upper top electrode portion 145b in the first stacked capacitor portion 142. The top electrode 145 (e.g., the lower top electrode portion 145a and the upper top electrode portion 145b) may also include, for example, TiN or TaN. Other suitable conductive materials for use as the top electrode 145 are within the contemplated scope of disclosure.

The first trench capacitor portion 141 may include a first lower conductive layer 141a on the isolation layer 130 located in the trench 113, a first lower dielectric layer 141b on the first lower conductive layer 141a, and the lower top electrode portion 145a. The first lower conductive layer 141a may include a terminal portion that may contact an upper surface of the isolation layer 130 at the bottom of the trench 113.

The first lower conductive layer 141a may be electrically isolated from the gate electrode 121 by the isolation layer 130, and may be separated from the lower top electrode portion 145a by the first lower dielectric layer 141b. The first lower conductive layer 141a may include, for example, TiN or TaN. The first lower dielectric layer 141b may include, for example, HZO, $HfO_2$, $AlO_x$ or other materials with high dielectric constants.

FIG. 1B provides a detailed illustration of the first stacked capacitor portion 142 according to one or more embodiments. As illustrated in FIG. 1B, the first stacked capacitor portion 142 may include a first plurality of stacked conductive layers 142a (e.g., lateral fins) that are located outside the trench 113 and coupled to the first source electrode 126 of the first transistor 120. The first stacked capacitor portion 142 may also include a first upper dielectric layer 142b on the first plurality of stacked conductive layers 142a. The first stacked capacitor portion 142 may also include the upper top electrode portion 145b that may be formed between the first plurality of stacked conductive layers 142a.

FIG. 1C provides a detailed illustration of the top electrode 145 in the first semiconductor device 100, according to one or more embodiments. As illustrated in FIG. 1C, the first upper dielectric layer 142b may cover an end (in the X-direction) of the first plurality of stacked conductive layers 142a. Further, the upper top electrode portion 145b may wrap around the ends of first plurality of stacked conductive layers 142a and into the spaces between the stacked layers of the first stacked capacitor portion 142 (e.g., between the first plurality of stacked conductive layers 142a).

A capacitance of the first capacitor 140 may be controlled by setting a depth of the trench 113 and/or by setting a characteristic (e.g., number, thickness, length, area, etc.) of the layers (e.g., stacked lateral fins) in the first stacked capacitor portion 142 outside the trench 113. Further, although the first trench capacitor portion 141 is illustrated in FIGS. 1A-1C as having a trench 113 with a particular depth, and the first stacked capacitor portion 142 is illustrated in FIGS. 1A-1C as including a particular number of stacked layers (e.g., stacked conductive layers having dielectric thereon), embodiments having deeper or shallower trenches and more or less layers are expressly contemplated.

Referring again to FIG. 1A, a second semiconductor device 200 (e.g., second memory cell) is also illustrated, according to one or more embodiments. The second semiconductor device 200 may have a similar structure and function as the first semiconductor device 100, and may be formed simultaneously with the first semiconductor device 100 and using the same method as the method of forming the first semiconductor device 100.

In particular, the second semiconductor device 200 may include, for example, an integrated capacitor and transistor for a 1-transistor/1-capacitor (1T1C) DRAM cell. As illustrated in FIG. 1A, the second semiconductor device 200 may include the insulating base 110 that may include the lower insulating layer 111 and the upper insulating layer 112.

The second semiconductor device 200 may also include a second transistor 220. The second transistor 220 may include a second gate electrode 221 formed in the outer trench portion 113b. The second transistor 220 may also include a second gate dielectric 222 formed on a side of the second gate electrode 221 in the outer trench portion 113b. A second vertical channel 223 may also be in the outer trench portion 113b. The second vertical channel 223 may be on a side of the second gate dielectric 222.

The second transistor 220 may also include a second drain electrode 224 that is in the lower insulating layer 111 (as shown in FIG. 1C), and a second source electrode 226 that is in the upper insulating layer 112 (as shown in FIG. 1C). The second drain electrode 224 and second source electrode 226 may contact the second vertical channel 223 and be separated in the Z-direction by the upper insulating layer 112.

The isolation layer 130 may be on the second gate electrode 221 (e.g., a lateral surface of the second gate electrode 221) in the trench 113. The isolation layer 130 may electrically isolate the second transistor 220 in second semiconductor device 200 from the first transistor 120 in first semiconductor device 100.

The second semiconductor device 200 may also include a second capacitor 240. The second capacitor 240 may include, for example, a hybrid stacked-trench capacitor having a second trench capacitor portion 241 that may be formed in the trench 113 and a second stacked capacitor portion 242 that may be formed outside the trench 113. The second capacitor 240 may also include a portion of the top electrode 145 that may serve, for example, as a ground electrode for both the second trench capacitor portion 241 and the second stacked capacitor portion 242.

The second trench capacitor portion 241 may include a second lower conductive layer 241a on the isolation layer 130 in the trench 113, a second lower dielectric layer 241b on the second lower conductive layer 241a, and the lower top electrode portion 145a. The second lower conductive layer 241a may include a terminal portion that may contact an upper surface of the isolation layer 130 at the bottom of the trench 113. The terminal portion of the second lower conductive layer 241a may be separated (in the X-direction in FIG. 1A) from the first lower conductive layer 141a by a dielectric layer portion that may connect the second lower dielectric layer 241b and first lower dielectric layer 141b. The second lower conductive layer 241a may be electrically isolated from the gate electrode 221 by the isolation layer 130, and may be separated from the lower top electrode portion 145a by the second lower dielectric layer 241b.

Referring again to FIG. 1B, a detailed illustration of the second stacked capacitor portion 242 is provided, according to one or more embodiments. As illustrated in FIG. 1B, the second stacked capacitor portion 242 may include a second plurality of stacked conductive layers 242a (e.g., lateral fins) that are located outside the trench 113 and coupled to the second source electrode 226 of the second transistor 220. The second stacked capacitor portion 242 may also include a second upper dielectric layer 242b on the second plurality of stacked conductive layers 242a. The second stacked capacitor portion 242 may also include the upper top electrode portion 145b between the second plurality of stacked conductive layers 242a.

Referring again to FIG. 1C, a detailed illustration of the top electrode 145 in the second semiconductor device 200 is provided, according to one or more embodiments. As illustrated in FIG. 1C, the second upper dielectric layer 242b may cover an end (in the X-direction) of the second plurality of stacked conductive layers 242a. Further, the upper top electrode portion 145b may wrap around the ends of the second plurality of stacked conductive layers 242a and into the spaces between the stacked layers of the second stacked capacitor portion 242 (e.g., between the second plurality of stacked conductive layers 242a.

A capacitance of the second capacitor 240 may be substantially the same as the capacitance of the first capacitor 140. The capacitance of the second capacitor 240 may also be controlled by setting a depth of the trench 113 and/or by setting a characteristic (e.g., number, thickness, length, area, etc.) of the layers (e.g., stacked lateral fins) in the second stacked capacitor portion 242 outside the trench 113.

Figure 2B:
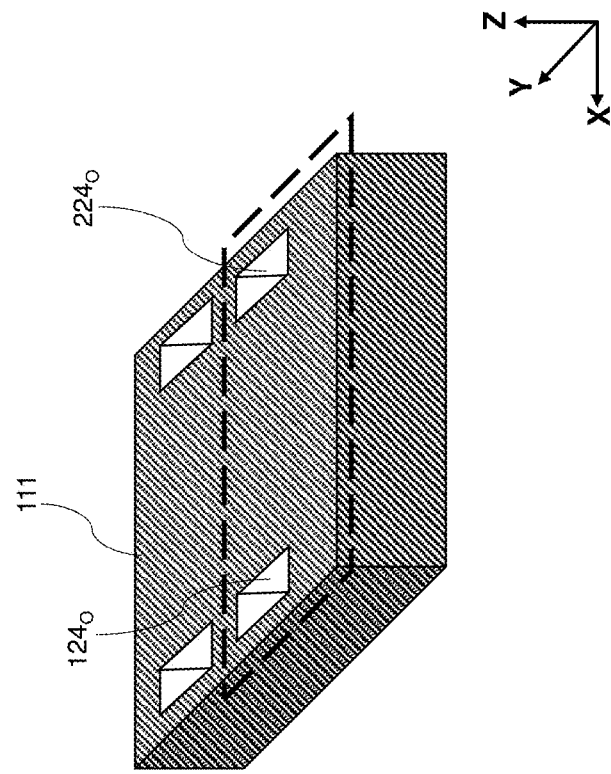
FIG. 2B illustrates an exemplary intermediate structure after formation of a first recessed portion and a second recessed portion in the lower insulating layer according to one or more embodiments.
Figure 2A:
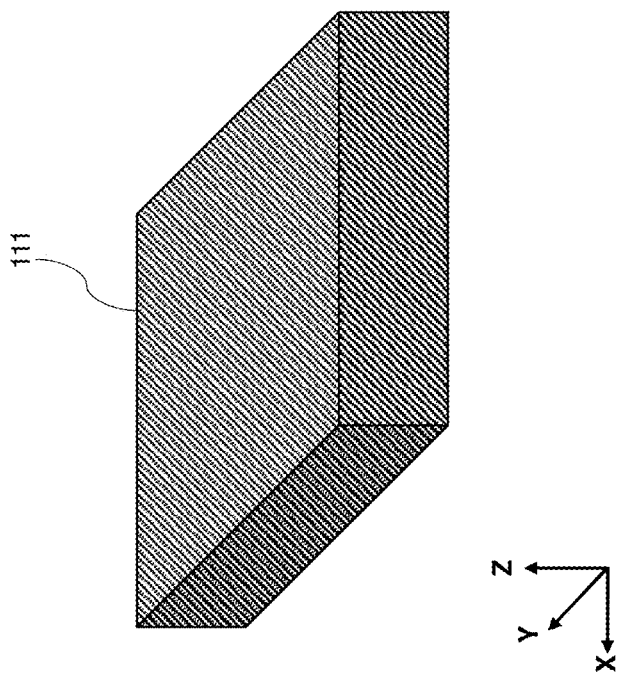
FIG. 2A illustrates an exemplary intermediate structure after formation of a lower insulating layer according to one or more embodiments.
Figure 2D:
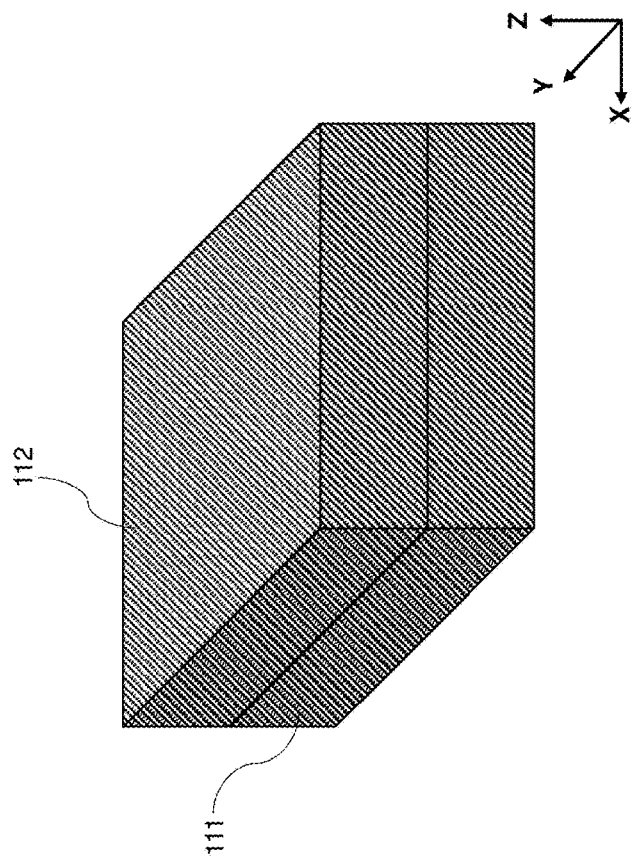
FIG. 2D illustrates an exemplary intermediate structure after formation of a upper insulating layer on the lower insulating layer according to one or more embodiments.
Figure 2C:
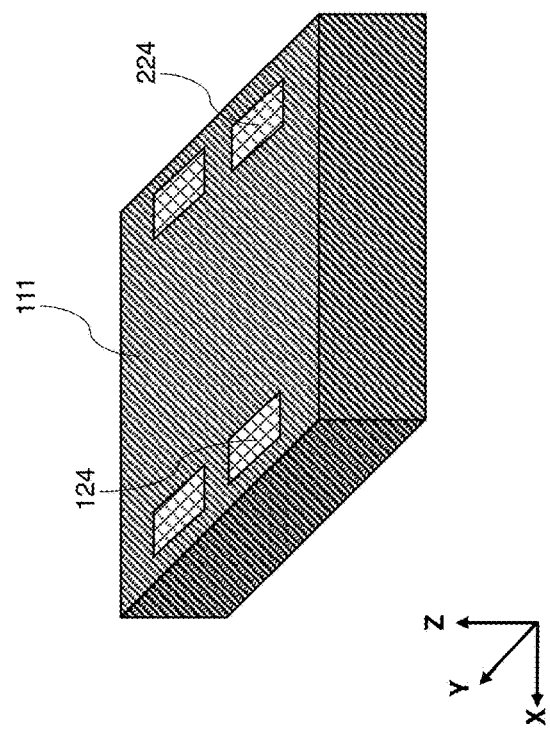
FIG. 2C illustrates an exemplary intermediate structure after formation of first drain electrode and second drain electrode according to one or more embodiments.
Figure 2F:
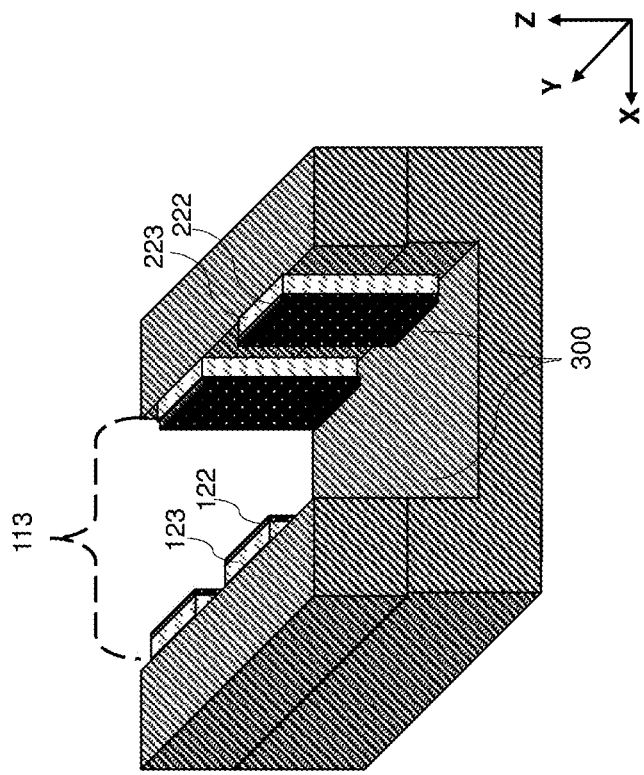
FIG. 2F illustrates an exemplary intermediate structure after formation of a first vertical channel, a second vertical channel, a first gate dielectric and a second gate dielectric according to one or more embodiments.
Figure 2E:
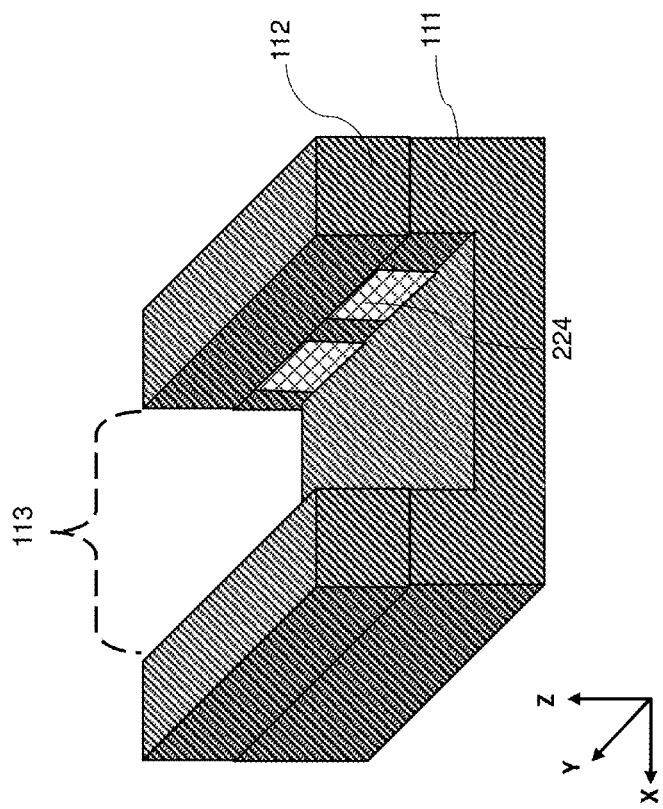
FIG. 2E illustrates an exemplary intermediate structure after formation of a trench in the lower insulating layer and upper insulating layer according to one or more embodiments.
Figure 2H:
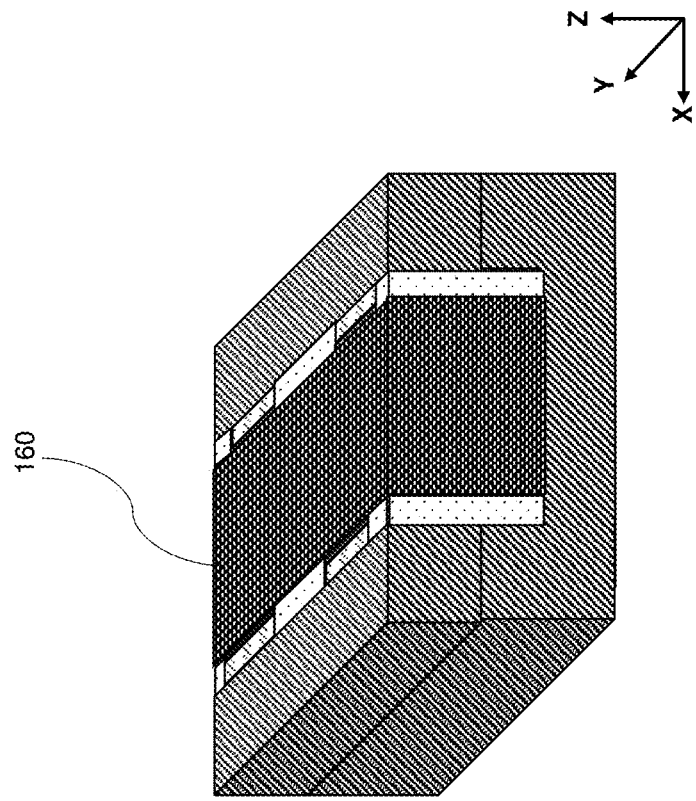
FIG. 2H illustrates an exemplary intermediate structure after formation of sacrificial material in the trench according to one or more embodiments.
Figure 2G:
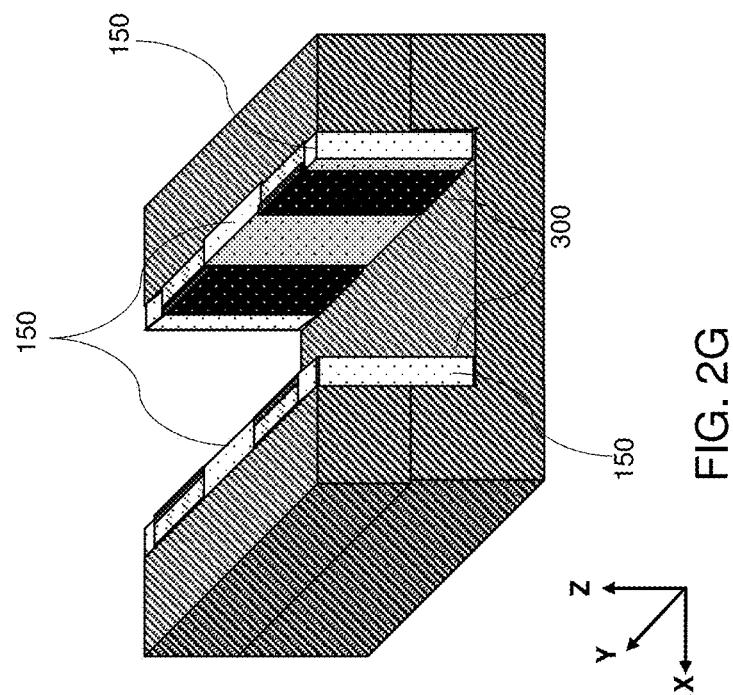
FIG. 2G illustrates an exemplary intermediate structure after formation of isolation material, and removal (e.g., by etching) of the isolation material at a wordline region according to one or more embodiments.
Figure 2J:
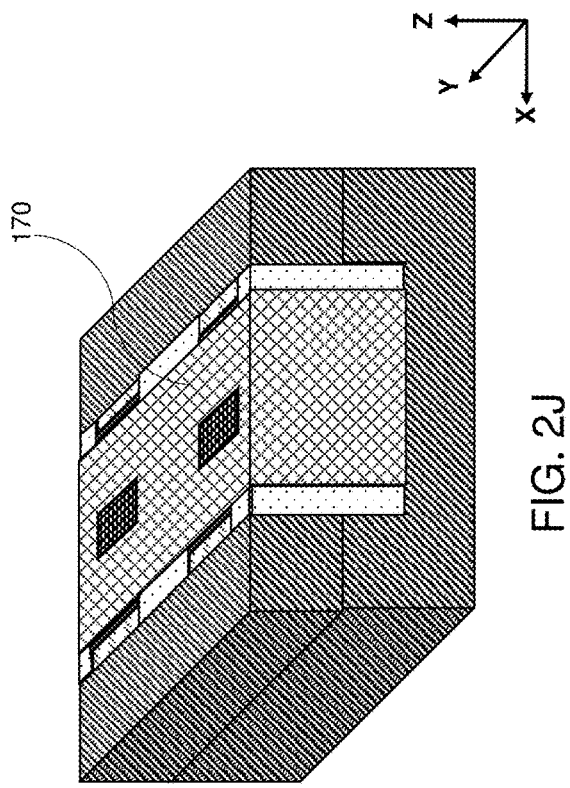
FIG. 2J illustrates an exemplary intermediate structure after formation of conductive material in the trench according to one or more embodiments.
Figure 2I:
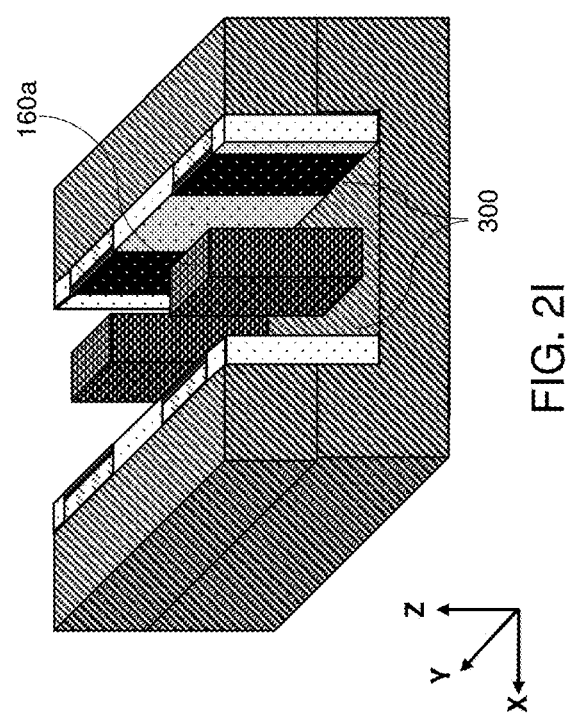
FIG. 2I illustrates an exemplary intermediate structure after removal of a portion of the sacrificial material according to one or more embodiments.
Figure 2K:
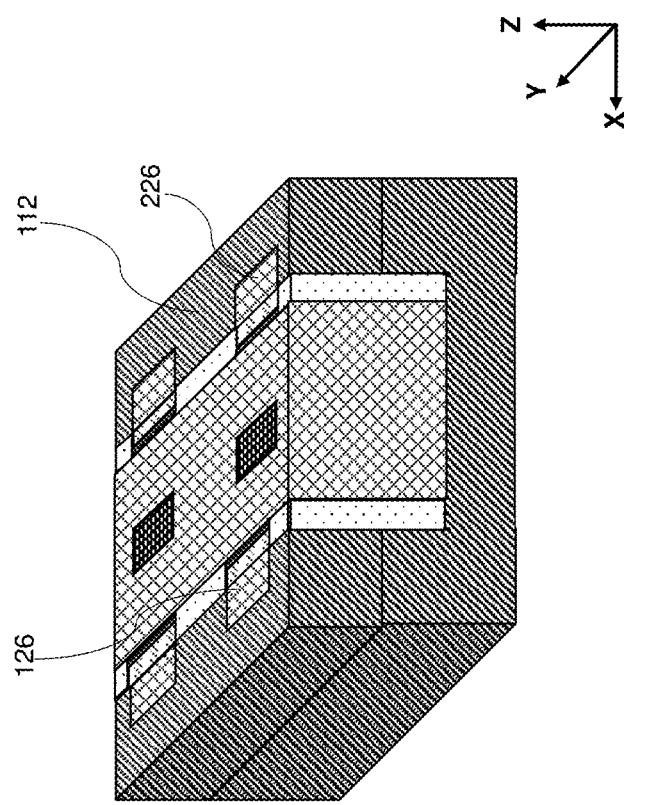
FIG. 2K illustrates an exemplary intermediate structure after formation of a first source electrode and a second source electrode according to one or more embodiments.
Figure 2L:
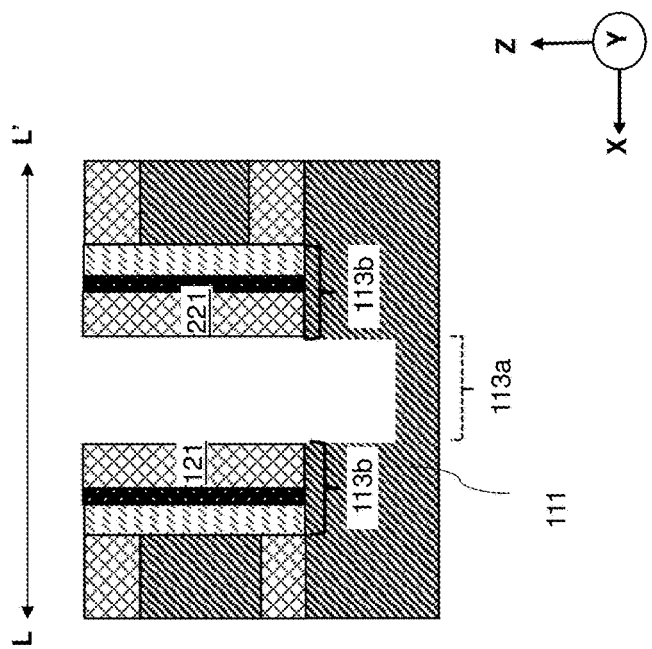
FIG. 2L provides a perspective view and cross-sectional view along the cross-section L-L' of the first semiconductor device and the second semiconductor device according to one or more embodiments.
Figure 2L:
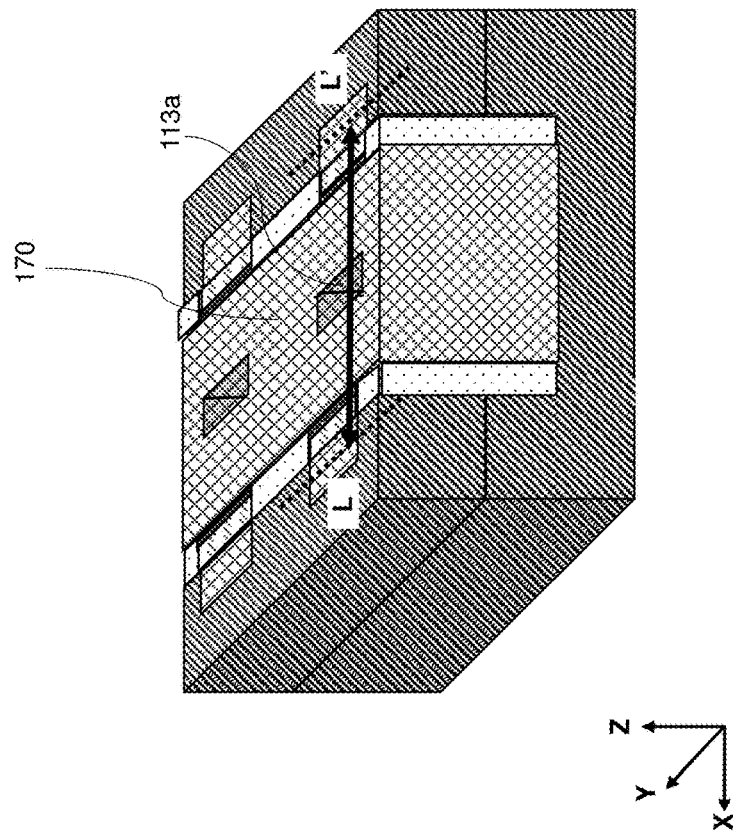
Figure 2M:
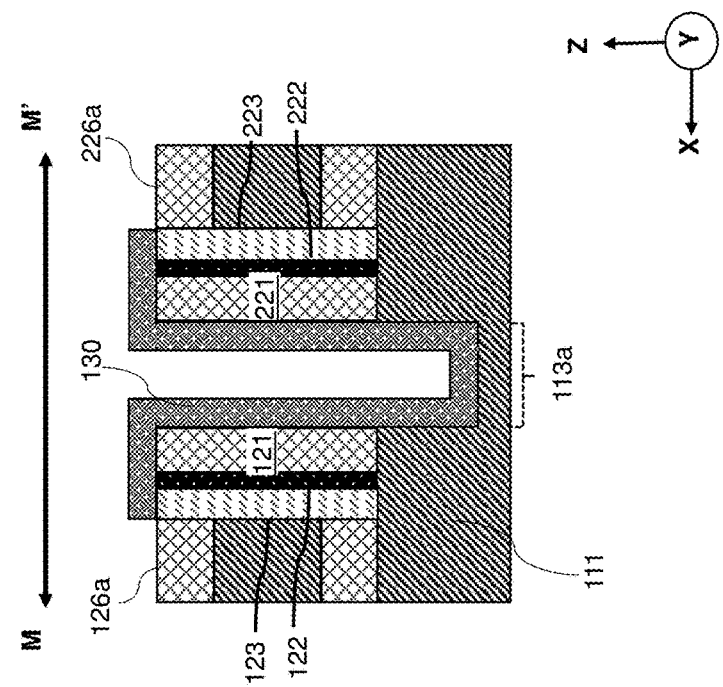
FIG. 2M provides a perspective view and cross-sectional view along the cross-section M-M' of the first semiconductor device and the second semiconductor device according to one or more embodiments.
Figure 2M:
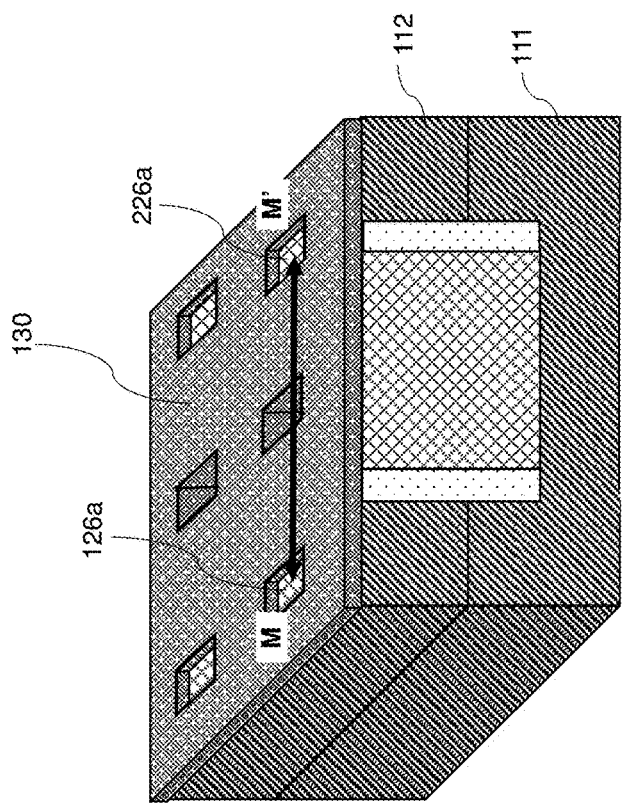
Figure 2N:
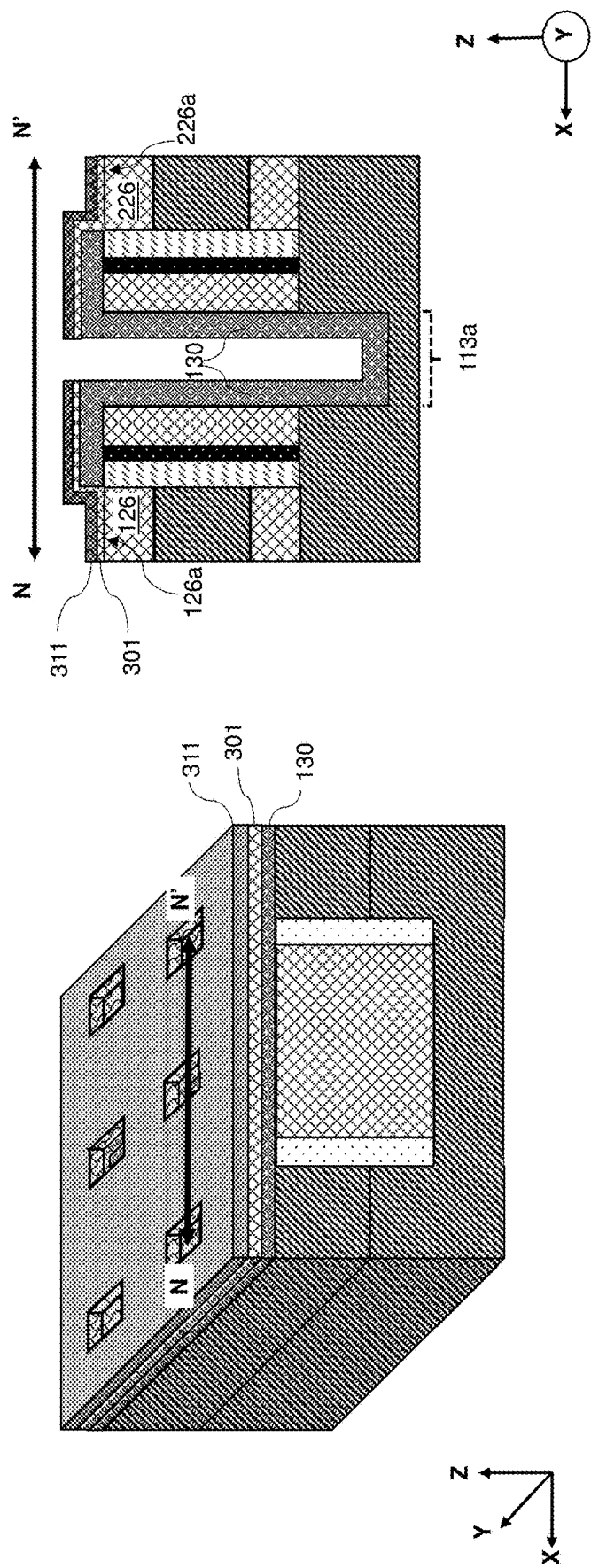
FIG. 2N provides a perspective view and cross-sectional view along the cross-section N-N' of the first semiconductor device and the second semiconductor device according to one or more embodiments.
Figure 2O:
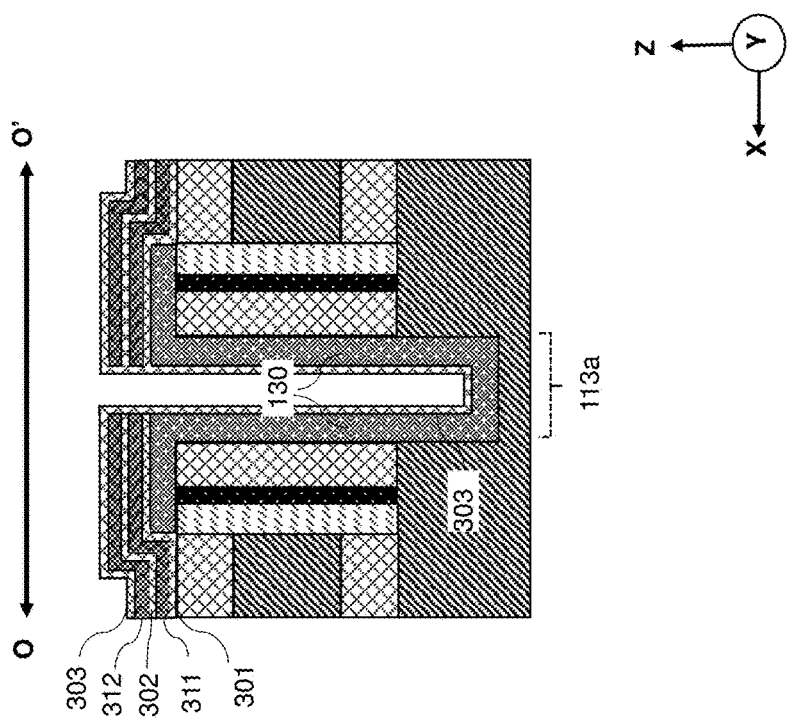
FIG. 2O provides a perspective view and cross-sectional view along the cross-section O-O' of the first semiconductor device and the second semiconductor device according to one or more embodiments.
Figure 2O:
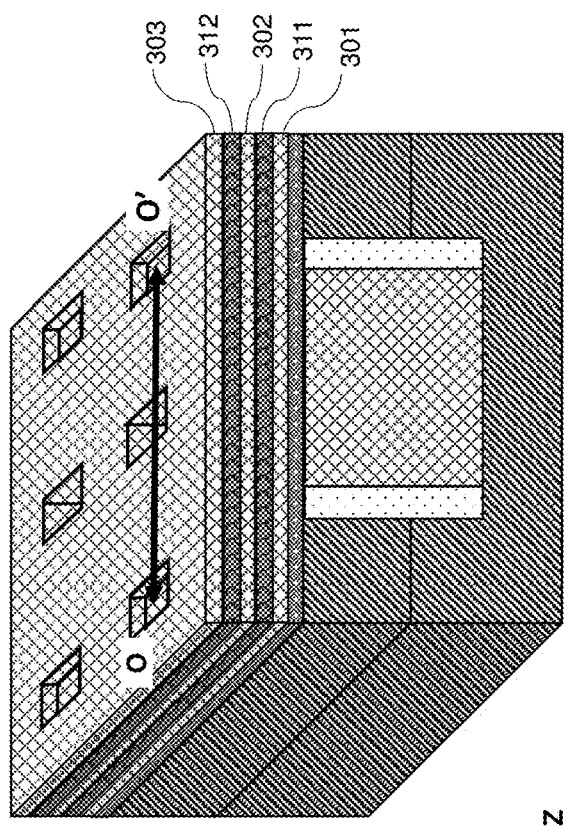
Figure 2P:
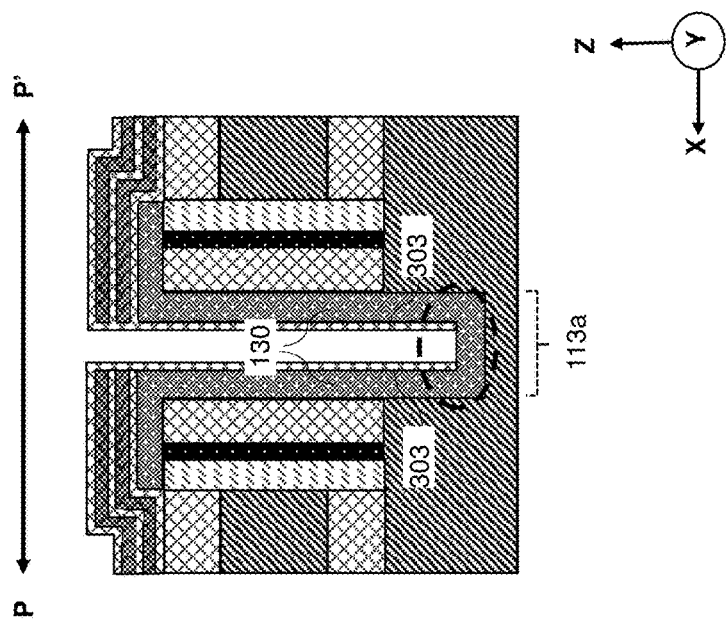
FIG. 2P provides a perspective view and cross-sectional view along the cross-section P-P' of the first semiconductor device and the second semiconductor device according to one or more embodiments.
Figure 2P:
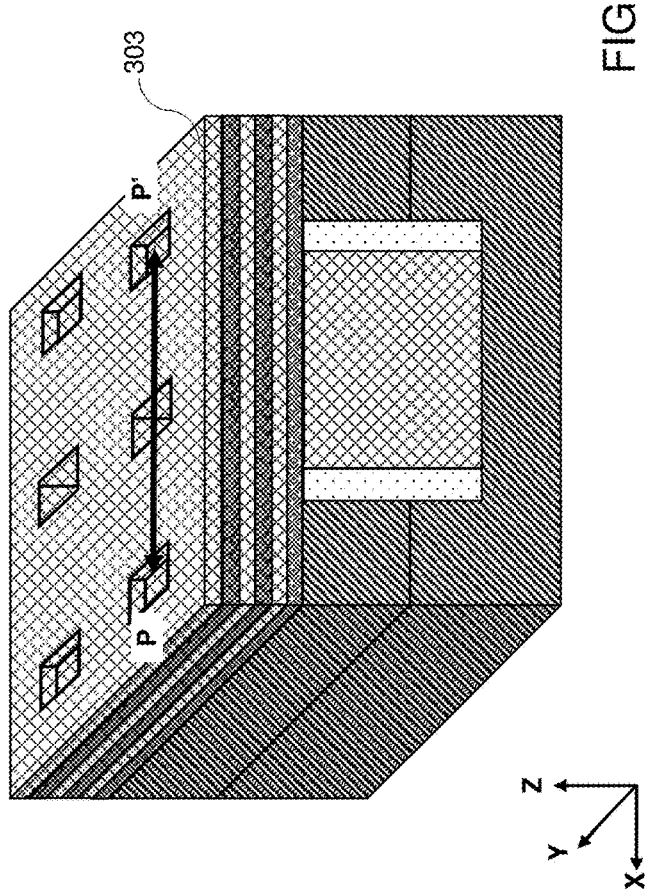
Figure 2Q:
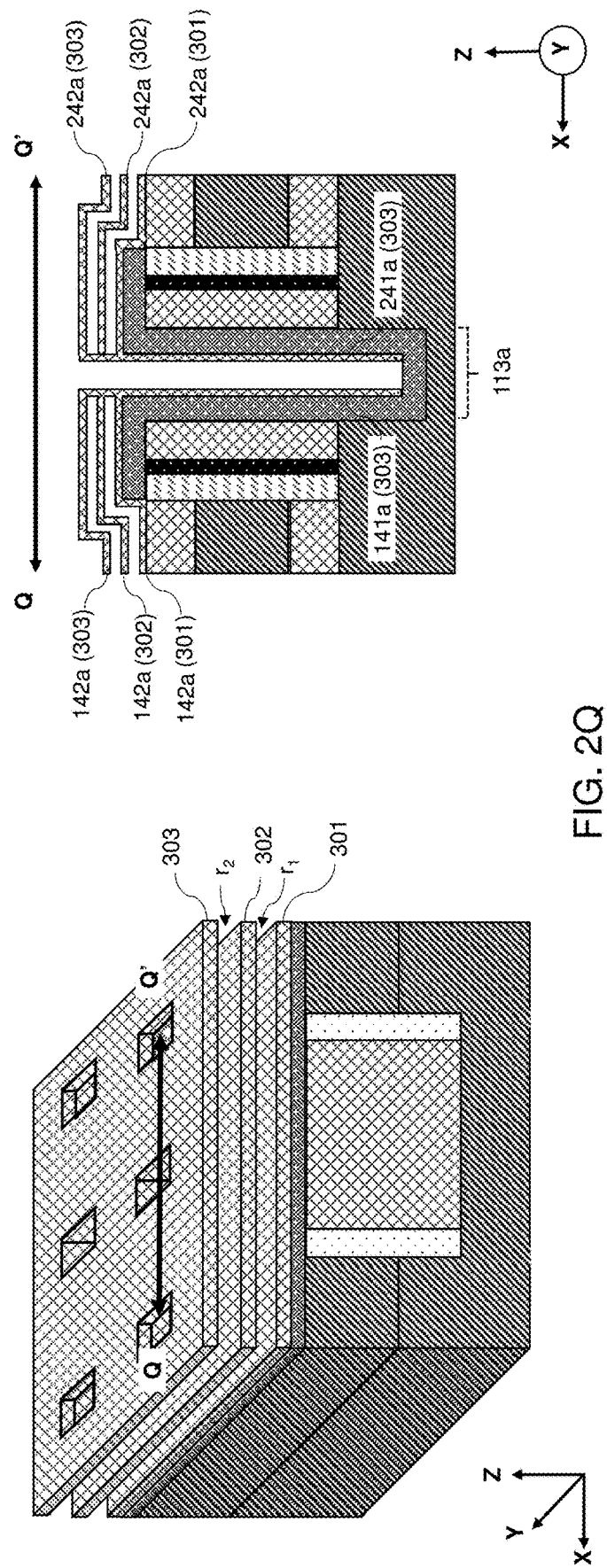
FIG. 2Q provides a perspective view and cross-sectional view along the cross-section Q-Q' of the first semiconductor device and the second semiconductor device according to one or more embodiments.
Figure 2R:
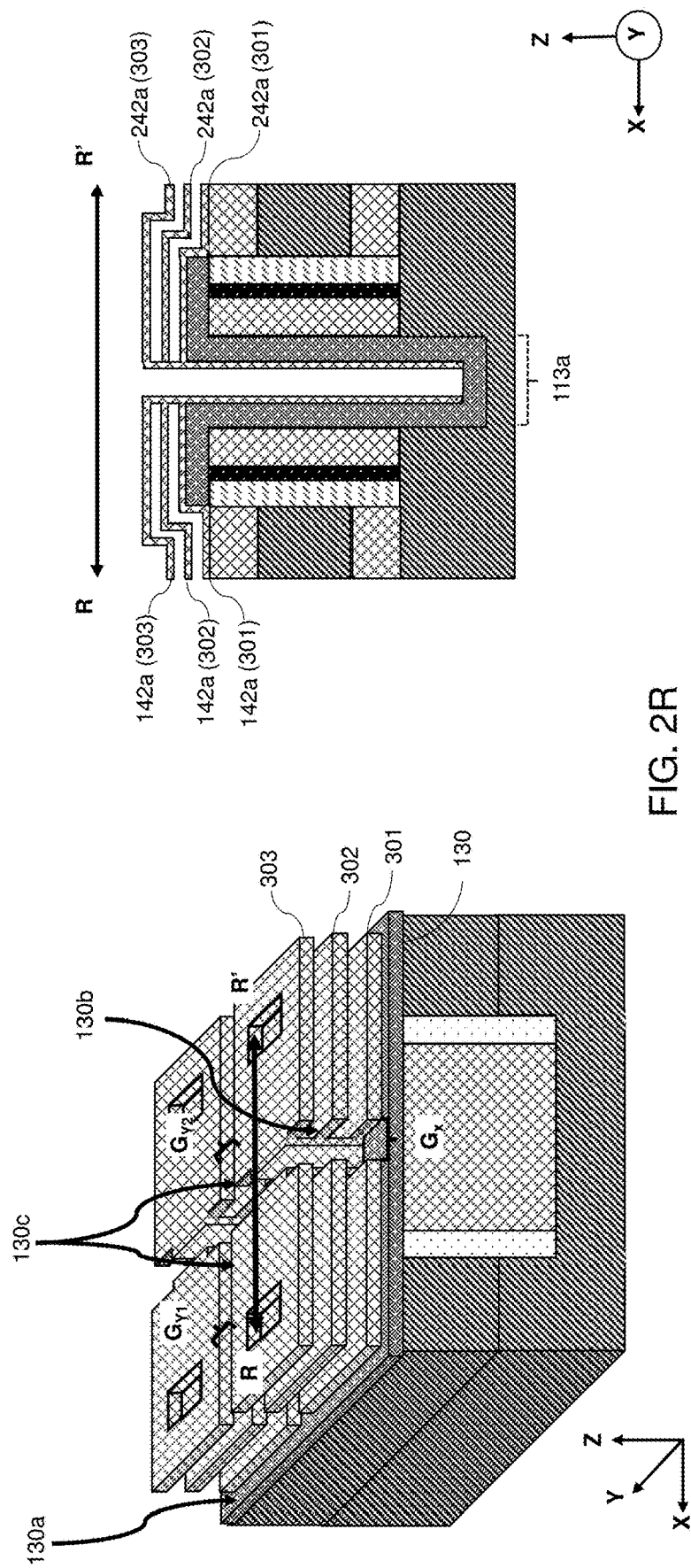
FIG. 2R provides a perspective view and cross-sectional view along the cross-section R-R' of the first semiconductor device and the second semiconductor device according to one or more embodiments.
Figure 2S:
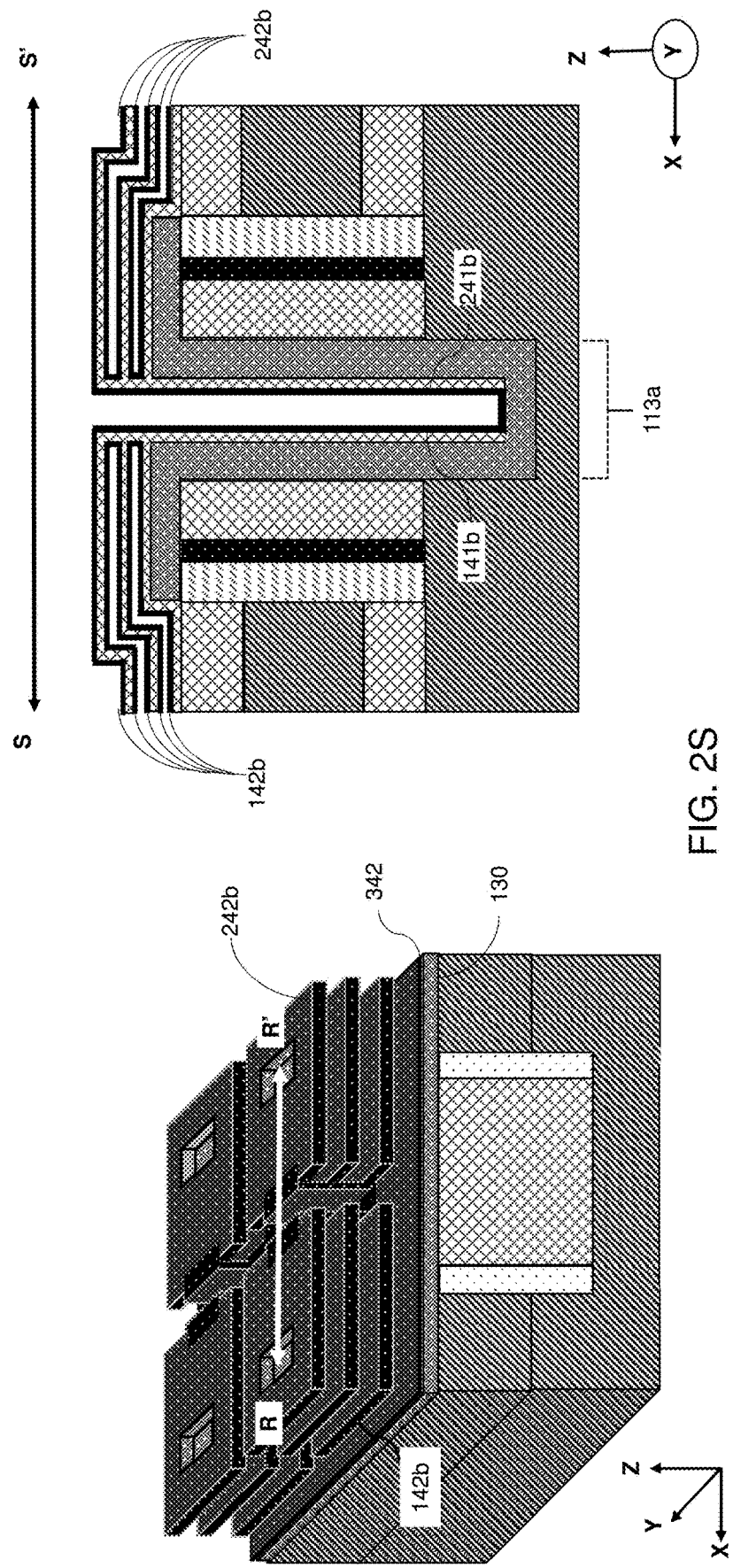
FIG. 2S provides a perspective view and cross-sectional view along the cross-section S-S' of the first semiconductor device and the second semiconductor device according to one or more embodiments.
Figure 2T:
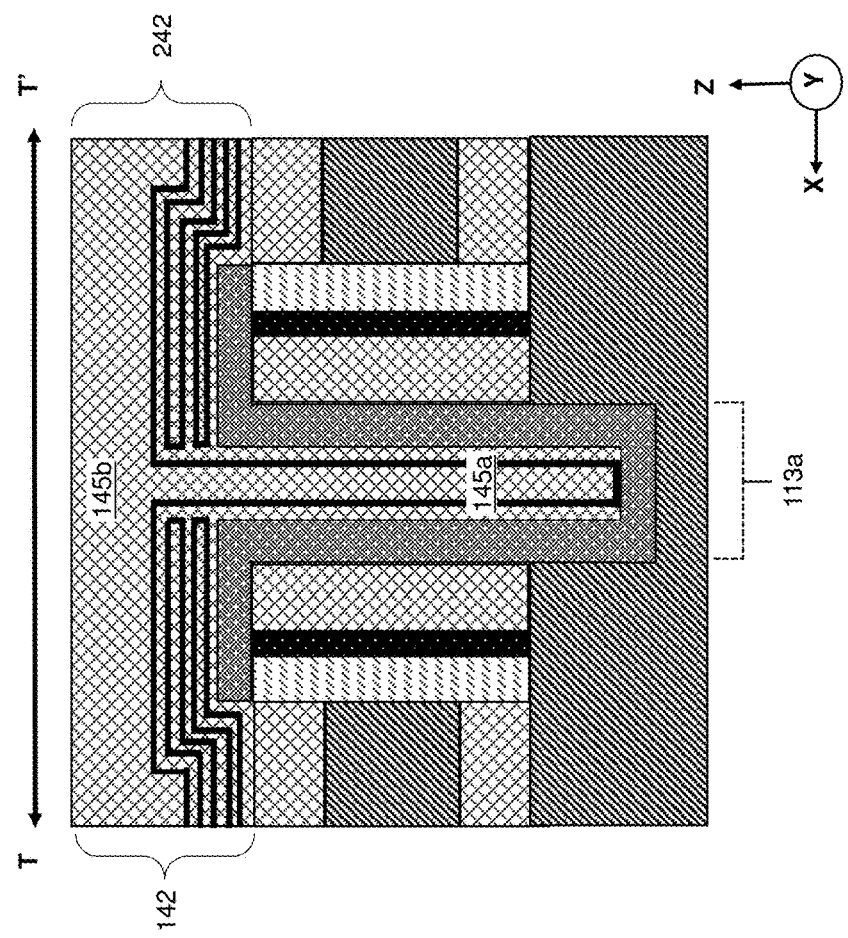
FIG. 2T provides a perspective view and cross-sectional view along the cross-section T-T' of the first semiconductor device and the second semiconductor device according to one or more embodiments.
Figure 2T:
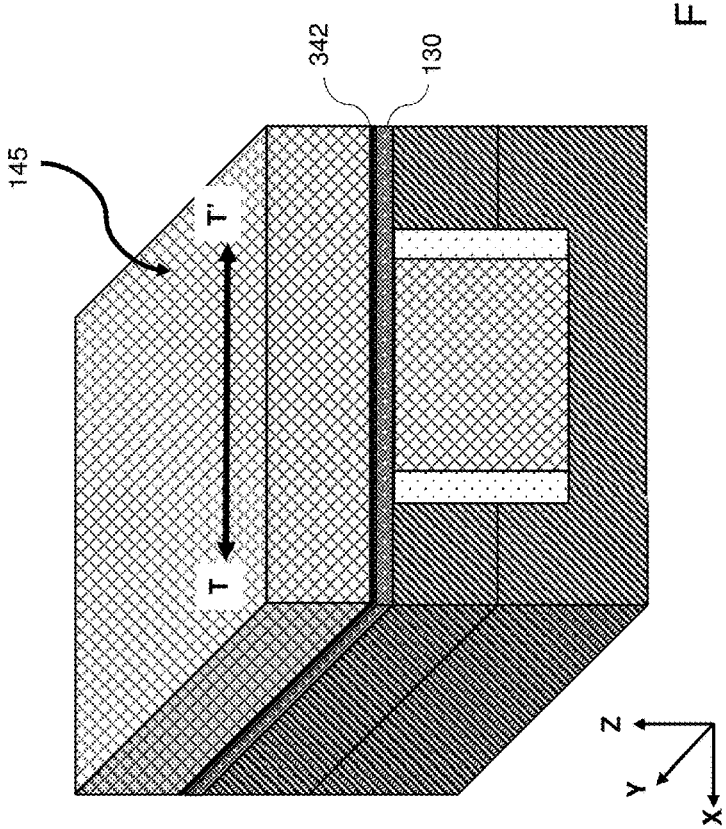

Referring again to the drawings, FIGS. 2A-2T illustrate sequential operations of a method of forming a semiconductor device (e.g., DRAM memory cell including integrated capacitor and transistor), according to one or more embodiments. The method illustrated in FIGS. 2A-2T may depict the forming (e.g., simultaneous forming) of four (4) DRAM memory cells (e.g., a 2×2 1T1C DRAM array) with each cell including an integrated capacitor and transistor. However, the method is not limited to such a configuration. Embodiment methods described herein may be used to form (e.g., simultaneously form) any number of DRAM memory cells. Further, although the drawings illustrate a method of forming four (4) semiconductor devices, for ease of explanation, the description of the method will be limited to the first semiconductor device 100 which is described above and illustrated in FIGS. 1A-1C, and the second semiconductor device 200 which is also described above and illustrated in FIGS. 1A-1C.

FIG. 2A illustrates an exemplary intermediate structure after formation of the lower insulating layer 111, according to one or more embodiments. As noted above, the lower insulating layer 111 may include, for example, an interlayer dielectric (ILD) and may be formed of a dielectric material such as silicon dioxide ($SiO_2$). The lower insulating layer 111 may be formed, for example, by chemical vapor deposition (CVD), plasma-enhanced CVD (PECVD), low pressure chemical vapor deposition (LPCVD), physical vapor deposition (PVD) or atomic layer deposition (ALD).

FIG. 2B illustrates an exemplary intermediate structure after formation of recessed portion $124_O$ and second recessed portion $224_O$ in the lower insulating layer 111, according to one or more embodiments. FIG. 2B may depict other features that are not pertinent to the forming of the first semiconductor device 100 and second semiconductor device 200 (e.g., indicated by the dashed line in FIG. 2B) and, therefore, will not be described.

The forming of recessed portion $124_O$ and second recessed portion $224_O$ in the lower insulating layer 111 may be performed, for example, by using a photolithographic process. The photolithographic process may include forming a patterned photoresist mask (not shown) on the lower insulating layer 111, and etching (e.g., wet etching, dry etching, etc.) the exposed upper surface of the lower insulating layer 111 through openings in the photoresist mask. The photoresist mask may be subsequently removed by ashing, dissolving the photoresist mask or by consuming the photoresist mask during the etch process.

FIG. 2C illustrates an exemplary intermediate structure after formation of the first drain electrode 124 and a second drain electrode 224, according to one or more embodiments. The forming of the first drain electrode 124 and the second drain electrode 224 may be performed, for example, by depositing a conductive material such as TiN or TaN in the first recessed portion $124_O$ and second recessed portion $224_O$ in the lower insulating layer 111. For example, the conductive material (e.g., TiN or TaN) may be deposited by thin film creation such as by physical vapor deposition (PVD, usually sputter deposition, cathodic arc deposition or electron beam heating) and chemical vapor deposition (CVD). In both methods, pure titanium (or tantalum) may be sublimed and reacted with nitrogen in a high-energy, vacuum environment.

After the forming of the first drain electrode 124 and the second drain electrode 224 in FIG. 2C, a planarization step such as chemical mechanical polishing (CMP) may be performed on the upper surface of the lower insulating layer 111 in order to form a co-planar surface of the first drain electrode 124, the second drain electrode 224 (e.g., the surface of the TiN or TaN) and the upper surface of the lower insulating layer 111.

FIG. 2D illustrates an exemplary intermediate structure after formation of the upper insulating layer 112 on the lower insulating layer 111, according to one or more embodiments. As noted above, the upper insulating layer 112 may include, for example, an interlayer dielectric (ILD) and may be formed of dielectric material such as silicon dioxide ($SiO_2$). The upper insulating layer 112 may be formed, for example, by chemical vapor deposition (CVD), plasma-enhanced CVD (PECVD), low pressure chemical vapor deposition (LPCVD), physical vapor deposition (PVD) or atomic layer deposition (ALD). As noted above, the lower insulating layer 111 and the upper insulating layer 112 together may constitute the insulating base 110.

FIG. 2E illustrates an exemplary intermediate structure after formation of the trench 113 in the insulating base 110, according to one or more embodiments. The forming of the trench 113 in the insulating base 110 may be performed, for example, by using a photolithographic process. The photolithographic process may include forming a patterned photoresist mask (not shown) on the upper insulating layer 112, and etching (e.g., wet etching, dry etching, etc.) the exposed upper surface of the upper insulating layer 112 and the underlying lower insulating layer 111 through openings in the photoresist mask. The photoresist mask may be subsequently removed by ashing, dissolving the photoresist mask or by consuming the photoresist mask during the etch process. The etching of the lower insulating layer 111 and the upper insulating layer 112 may be performed so as to expose a sidewall of the first drain electrode 124 (not shown in FIG. 2E) and a sidewall of the second drain electrode 224. That is, a portion of one sidewall of the trench 113 may be defined by a sidewall of the first drain electrode 124, and a portion of the opposing sidewall of the trench 113 may be defined by a sidewall of the second drain electrode 224.

FIG. 2F illustrates an exemplary intermediate structure after formation of the first vertical channel 123, the second vertical channel 223, the first gate dielectric 122 and the second gate dielectric 222, according to one or more embodiments. The forming of the first vertical channel 123, the second vertical channel 223, the first gate dielectric 122 and the second gate dielectric 222 may be performed, for example, by first depositing a conformal layer of channel material (i.e., the material of the first vertical channel 123 and the second vertical channel 223) on the opposing sidewalls of the trench 113. As noted above, the channel material may include, for example, one or more of InZnO (IZO), indium tin oxide (ITO), $In_2O_3$, $Ga_2O_3$, InGaZnO, ZnO, $Al_2O_5Zn_2$ aluminum-doped ZnO (AZO), IWO, $TiO_x$. The channel material may also include, for example, semiconductor materials including other Group III-V materials, and combinations (e.g., alloys or stacked layers) of such semiconductor materials. Other suitable semiconducting materials for use as the channel material are within the contemplated scope of disclosure.

The material of the first gate dielectric 122 and the second gate dielectric 222 may be conformally-formed by deposition on the conformally-formed channel material (i.e., first vertical channel 123 and second vertical channel 223). As noted above, the material of the first gate dielectric 122 and second gate dielectric 222 may include, for example, $SiO_2$, $Al_2O_3$ $HfO_2$, $TiO_2$ or $ZrO_2$. Other suitable dielectric materials are within the contemplated scope of disclosure. The channel material and gate dielectric material may then be partially removed (e.g., etched away) from the sidewalls of the trench 113, so as to form the first vertical channel 123 and the first gate dielectric 122 on one sidewall of the trench 113, and the second vertical channel 223 and the second gate dielectric 222 on the opposing sidewall of the trench 113, as illustrated in FIG. 2F. Further, the removal (e.g., etching) in this step may clear a word line (WL) region 300 in the trench 113 to allow for the subsequent formation the first gate electrode 121 and the second gate electrode 221 that may be connected to a word line of a DRAM array.

Each of the channel material and the gate dielectric material may be deposited by chemical vapor deposition (CVD), plasma-enhanced CVD (PECVD), low pressure chemical vapor deposition (LPCVD), physical vapor deposition (PVD) or atomic layer deposition (ALD). The removal of the channel material and gate dielectric material may be performed by using a photolithographic process that may include forming a patterned photoresist mask (not shown) on the channel material and gate dielectric material. For example, a photoresist material may be initially formed so as to fill the trench 113, and then patterned so as to expose the portions of channel material and gate dielectric material to be removed from the sidewalls of the trench 113. Then the exposed portions of channel material and gate material may be etched (e.g., by wet etching, dry etching, etc.) so as to etch away the exposed portions of both the channel material and gate dielectric material in one etching step.

FIG. 2G illustrates an exemplary intermediate structure after the deposition of isolation material 150, and removal (e.g., by etching) of the isolation material 150 at the WL region 300, according to one or more embodiments. A layer of the isolation material 150 may first be deposited so as to fill the trench 113, and then the isolation material 150 in the trench 113 may be removed (e.g., by etching) at the WL region 300 so that the isolation material 150 remains only on the exposed sidewalls (see FIG. 2F) of the trench 113. The isolation material 150 may include, for example, $AlO_x$, or another material with high selectivity to sacrificial oxide.

The deposited layer of isolation material 150 may have a thickness on the sidewalls of the trench 113 that is substantially the same as a combined thickness of the first vertical channel 123 and the first dielectric material 122 on one sidewall of the trench 113, and substantially the same as a combined thickness of the second vertical channel 223 and the second dielectric material 222 on the opposing sidewall of the trench 113.

The isolation material 150 may be deposited by chemical vapor deposition (CVD), plasma-enhanced CVD (PECVD), low pressure chemical vapor deposition (LPCVD), physical vapor deposition (PVD) or atomic layer deposition (ALD). The removal of the isolation material 150 may be performed by using a photolithographic process that may include forming a patterned photoresist mask (not shown) on the isolation material 150, and etching (e.g., wet etching, dry etching, etc.) the isolation material 150 so as to form the isolation material 150 on the exposed sidewalls of the trench 113 as illustrated in FIG. 2G.

FIG. 2H illustrates an exemplary intermediate structure after formation of the sacrificial material 160 in the trench 113, according to one or more embodiments. The sacrificial material 160 may be formed in the trench 113, for example, by depositing a layer of the sacrificial material 160 in the trench 113, such as by chemical vapor deposition (CVD), plasma-enhanced CVD (PECVD), low pressure chemical vapor deposition (LPCVD), physical vapor deposition (PVD) or atomic layer deposition (ALD). The sacrificial material 160 may include, for example, silicon nitride.

FIG. 2I illustrates an exemplary intermediate structure after the removal of a portion of the sacrificial material 160, according to one or more embodiments. The sacrificial material 160 (e.g., silicon nitride) may be removed, for example, along the opposing sidewalls of the trench 113, to form a sacrificial material pillar 160a in a central portion (in the X-direction) of the trench 113. A gap constituting the word line region 300 may thus be formed between the first gate dielectric 122 and the sacrificial material pillar 160a on one side of the trench 113, and another gap constituting the word line region 300 may be formed between the second gate dielectric 222 and the sacrificial material pillar 160a on the opposing side of the trench 113. The removal of a portion of the sacrificial material 160 may be performed, for example, by using a photolithographic process. The photolithographic process may include forming a patterned photoresist mask (not shown) on the sacrificial material 160, and etching (e.g., wet etching, dry etching, etc.) the sacrificial material 160 so as to form the sacrificial material pillars 160a as illustrated in FIG. 2I.

FIG. 2J illustrates an exemplary intermediate structure after formation of conductive material 170 in the trench 113, according to one or more embodiments. As illustrated in FIG. 2J, the conductive material 170 may be formed in the word line (WL) region 300 on a side of the first gate dielectric 122 and on a side of the second gate dielectric 222 and may constitute the first gate electrode 121 of the first semiconductor device 100 and the second gate electrode 221 of the second semiconductor device 200. The conductive material 170 may include, for example, TiN or TaN. The forming of conductive material 170 in the trench 113 may be performed, for example, by depositing the conductive material 170 by chemical vapor deposition (CVD), plasma-enhanced CVD (PECVD), low pressure chemical vapor deposition (LPCVD), physical vapor deposition (PVD) or atomic layer deposition (ALD).

FIG. 2K illustrates an exemplary intermediate structure after formation of the first source electrode 126 and the second source electrode 226, according to one or more embodiments. The forming of the first source electrode 126 and the second source electrode 226 may include, for example, forming (e.g., by etching) recessed portions in the upper insulating layer 112 that correspond to a location and shape of the first source electrode 126 and the second source electrode 226. The forming (e.g., by etching) of recessed portions in upper insulating layer 112 may be done, for example, by using a photolithographic process. The photolithographic process may include forming a patterned photoresist mask (not shown) on the upper insulating layer 112, and etching (e.g., wet etching, dry etching, etc.) the upper insulating layer 112 so as to form the recessed portions. The recessed portions may expose part of an outer sidewall (in the X-direction) of the first vertical channel 123 and part of an outer sidewall (in the X-direction) of the second vertical channel 223.

A layer of conductive material (e.g., TiN or TaN) may be formed in the recessed portions. The conductive material may be deposited, for example, by chemical vapor deposition (CVD), plasma-enhanced CVD (PECVD), low pressure chemical vapor deposition (LPCVD), physical vapor deposition (PVD) or atomic layer deposition (ALD). The layer of conductive material (e.g., TiN or TaN) may then be planarized such as by CMP in order to make an upper surface of the first source electrode 126 and an upper surface of the second source electrode 226 to be coplanar with an upper surface of the upper insulating layer 112.

FIG. 2L provides a perspective view and cross-sectional view along the cross-section L-L' of the first semiconductor device 100 and second semiconductor device 200, according to one or more embodiments. The cross-sectional view in FIGS. 2L-2T may be bounded in the X-direction along the dashed lines in the perspective view of FIG. 2L.

FIG. 2L illustrates the removal of the sacrificial material pillars 160a and formation of the inner trench portion 113a in the place of the sacrificial material pillars 160a. The sacrificial material pillars 160a may be removed, for example, by etching of the sacrificial material so as to form a recessed portion in the conductive material 170 (e.g., TiN or TaN). The etching may be done, for example, by using a photolithographic process that may include forming a patterned photoresist mask (not shown) on the conductive material 170, and performing an anisotropic etch process (e.g., wet etching, dry etching, etc.) that is selective to the sacrificial material so as to form the recessed portions within the conductive material 170. The etching may also continue down into the lower insulating layer 111 so as to form the inner trench portion 113a having a depth that may be greater than a depth of the outer trench portion 113b.

FIG. 2M provides a perspective view and cross-sectional view along the cross-section M-M' of the first semiconductor device 100 and second semiconductor device 200, according to one or more embodiments. FIG. 2M illustrates the forming of the isolation layer 130 in the inner trench portion 113a. The isolation layer 130 may be deposited, for example, by chemical vapor deposition (CVD), plasma-enhanced CVD (PECVD), low pressure chemical vapor deposition (LPCVD), physical vapor deposition (PVD) or atomic layer deposition (ALD). The isolation layer 130 may include, for example, $AlO_x$, or any other electrically insulating material with a high selectivity to sacrificial oxide (e.g., silicon oxide, silicon nitride).

The isolation layer 130 may not fill the inner trench portion 113a, but may be only conformally deposited on the inner sidewall of the first gate electrode 121 and on the inner sidewall of the second gate electrode 221. In addition, at the bottom of the inner trench portion 113a, the isolation layer 130 may be conformally formed on the inner sidewall of the lower insulating layer 111. The isolation layer 130 may also be formed on an upper surface of the first gate electrode 121, first gate dielectric 122 and first vertical channel 123 on one side of the inner trench portion 113a, and on an upper surface of the second gate electrode 221, second gate dielectric 222 and second vertical channel 223 on the opposite side of the inner trench portion 113a.

FIG. 2M also illustrates the removal (e.g., by etching) of the isolation layer 130 layer over the upper surface 126a of the first source electrode 126 and over the upper surface 226a of the second source electrode 226, so as to expose the upper surface 126a of the first source electrode 126 and upper surface 226a of the second source electrode 226. The etching may be performed, for example, by using a photolithographic process. The photolithographic process may include forming a patterned photoresist mask (not shown) on the isolation layer 130, and etching (e.g., wet etching, dry etching, etc.) the isolation layer 130 through the patterned photoresist mask so as to expose the upper surface 126a of the first source electrode 126 and upper surface 226a of the second source electrode 226.

FIG. 2N provides a perspective view and cross-sectional view along the cross-section N-N' of the first semiconductor device 100 and second semiconductor device 200, according to one or more embodiments. As illustrated in FIG. 2N, a first conductive material layer 301 (e.g., TiN or TaN) may be deposited on the isolation layer 130 outside the inner trench potion 113a. The first conductive material layer 301 may also be formed on the upper surface 126a of the first source electrode 126 and on the upper surface 226a of the second source electrode 226. The first conductive material layer 301 may become a conductive layer of the first plurality of stacked conductive layers 142a on one side of the inner trench portion 113a, and a conductive layer of the second plurality of stacked conductive layers 242a on the other side of the inner trench portion 113a. The first conductive material layer 301 may be deposited (e.g., in one deposition step), for example, by chemical vapor deposition (CVD), plasma-enhanced CVD (PECVD), low pressure chemical vapor deposition (LPCVD), physical vapor deposition (PVD) or atomic layer deposition (ALD).

FIG. 2N also illustrates the forming of a first sacrificial layer 311 on the first conductive material layer 301. The first sacrificial layer 311 may be formed, for example, in order to space apart the stacked layers of the first stacked capacitor portion 142 and to space apart the stacked layers of the second stacked capacitor portion 242. The first sacrificial layer 311 may be formed, for example, of silicon oxide or silicon nitride, and may be deposited, for example, by chemical vapor deposition (CVD), plasma-enhanced CVD (PECVD), low pressure chemical vapor deposition (LPCVD), physical vapor deposition (PVD) or atomic layer deposition (ALD).

An etching step may then be performed in order to remove from the inner trench portion 113a any of the materials from the forming of the first conductive material layer 301 and the forming of the first sacrificial layer 311. As illustrated in FIG. 2N, this etching step may result in an inner sidewall of the first conductive material layer 301 and an inner sidewall of the first sacrificial layer 311 being substantially aligned with an inner sidewall of the isolation layer 130. The etching may be performed, for example, by using a photolithographic process that may include forming a patterned photoresist mask on the first sacrificial layer 311 and etching away (e.g., wet etching, dry etching, etc.) any excess material in the inner trench portion 113a so as to expose the inner sidewall of the isolation layer 130 in the inner trench portion 113a.

FIG. 2O provides a perspective view and cross-sectional view along the cross-section O-O' of the first semiconductor device 100 and second semiconductor device 200, according to one or more embodiments. FIG. 2O illustrates the repeating of the steps described above with respect to FIG. 2N in order to deposit a second conductive material layer 302 (e.g., TiN or TaN) on the first sacrificial layer 311, and deposit a second sacrificial layer 312 (e.g., silicon oxide or silicon nitride) on the second conductive material layer 302. The second conductive material layer 302 may also become a conductive layer of the first plurality of stacked conductive layers 142a and a conductive layer of the second plurality of stacked conductive layers 242a.

After the deposition of the second sacrificial layer 312 an etching step may be performed in order to remove from the inner trench portion 113a any of the materials from the deposition of the second conductive material layer 302 and the deposition of the second sacrificial layer 312. The etching may be performed, for example, by using a photolithographic process that may include forming a patterned photoresist mask on the second sacrificial layer 312 and etching away (e.g., wet etching, dry etching, etc.) any excess material in the inner trench portion 113a so as to again expose the inner sidewall of the isolation layer 130 in the inner trench portion 113a.

Then, a third conductive material layer 303 may be deposited on the second sacrificial layer 312. The third conductive material layer 303 may also become a conductive layer of the first plurality of stacked conductive layers 142a and a conductive layer of the second plurality of stacked conductive layers 242a. The third conductive material layer 303 may be deposited, for example, by chemical vapor deposition (CVD), plasma-enhanced CVD (PECVD), low pressure chemical vapor deposition (LPCVD), physical vapor deposition (PVD) or atomic layer deposition (ALD).

As illustrated in the cross-sectional view in FIG. 2O, the third conductive material layer 303 may be formed over the inner trench portion 113a so as to connect to the first conductive material layer 301 and the second conductive material layer 302 over the inner trench portion 113a. In addition, as also illustrated in FIG. 2O, the third conductive material layer 303 may be formed on the sidewall of the isolation layer 130 in the inner trench portion 113a and on the isolation layer 130 at the bottom of the inner trench portion 113a. The portion of the third conductive material layer 303 that is formed in the inner trench portion 113a may become the first lower conductive layer 141a of the first trench capacitor portion 141, and the second lower conductive layer 241a of the second trench capacitor portion 241.

FIG. 2P provides a perspective view and cross-sectional view along the cross-section P-P' of the first semiconductor device 100 and second semiconductor device 200, according to one or more embodiments. FIG. 2P illustrates the removal of the third conductive material layer 303 (e.g., TiN or TaN) on the isolation layer 130 at the bottom of the trench 113. As highlighted by the dashed oval in the cross-sectional view in FIG. 2P, the removal of the third conductive material layer 303 here may result in terminal portions of the third conductive material layer 303 contacting the upper surface of the isolation layer 130 at the bottom of the inner trench portion 113a. The terminal portions of the third conductive material layer 303 may become the terminal portion of the first lower conductive layer 141a and the terminal potion of the second lower conductive layer 241a. The removal of the third conductive material layer 303 may be performed, for example, by etching using a photolithographic process that may include forming a patterned photoresist mask on the third conductive material layer 303, and etching away (e.g., wet etching, dry etching, etc.) the third conductive material layer 303 from the bottom of the inner trench portion 113a so as to expose the upper surface of the isolation layer 130 at the bottom of the inner trench portion 113a.

FIG. 2Q provides a perspective view and cross-sectional view along the cross-section Q-Q' of the first semiconductor device 100 and second semiconductor device 200, according to one or more embodiments. FIG. 2Q illustrates the removal of the first sacrificial layer 311 and second sacrificial layer 312 that may result in the formation of a plurality of horizontal recessed portions $r_1$, $r_2$ between the first conductive material layer 301, second conductive material layer 302 and third conductive material layer 303.

As illustrated in the cross-sectional view of FIG. 2Q, on one side of the inner trench portion 113a (e.g., the side of the first semiconductor device 100), the first conductive material layer 301, second conductive material layer 302 and third conductive material layer 303 may constitute the conductive layers of the first plurality of stacked conductive layers 142a. On the opposite side of the inner trench portion 113a (e.g., the side of the second semiconductor device 200), the first conductive material layer 301, second conductive material layer 302 and third conductive material layer 303 may constitute the conductive layers of the second plurality of stacked conductive layers 242a.

The removal of the first sacrificial layer 311 and second sacrificial layer 312 may be performed, for example, by etching using a photolithographic process that may include etching away (e.g., wet etching, dry etching, etc.) the sacrificial material (e.g., silicon oxide or silicon nitride) that filled the plurality of horizontal recessed portions $r_1$, $r_2$.

FIG. 2R provides a perspective view and cross-sectional view along the cross-section R-R' of the first semiconductor device 100 and second semiconductor device 200, according to one or more embodiments. FIG. 2R illustrates the partial removal (e.g., etching back) of the first conductive material layer 301, second conductive material layer 302 and third conductive material layer 303. This step may be performed to separate the first plurality of stacked conductive layers 142a from the second plurality of stacked conductive layers 242a. This step may also divide the first plurality of stacked conductive layers 142a and second plurality of stacked conductive layers 242a, from adjacent memory cells (e.g., in the Y-direction) in the DRAM device. This step may also be performed to expose an upper surface of the isolation layer 130 in preparation of forming the top electrode 145 on the upper surface of the isolation layer 130 in a later step.

As illustrated in the perspective view of FIG. 2R, the partial removal of the first conductive material layer 301, second conductive material layer 302 and third conductive material layer 303 may be focused on at least three regions of the isolation layer 130. The first region may include region 130a that is around a perimeter of the isolation layer 130. The second region may include region 130b that is between the conductive layers of the first plurality of stacked conductive layers 142a and the second plurality of stacked conductive layers 242a. By exposing region 130b of the isolation layer 130, the first plurality of stacked conductive layers 142a and the second plurality of stacked conductive layers 242a may be separated by a gap Gx. The third region may include region 130c that is between the first plurality of stacked conductive layers 142a and the second plurality of stacked conductive layers 242a on one hand, and adjacent memory cells (e.g., in the Y-direction) in the DRAM device on the other hand. By exposing region 130c of the isolation layer 130, a gap $G_{Y1}$ may be formed between the first plurality of stacked conductive layers 142a and an adjacent memory cell (e.g., in the Y-direction), and a gap $G_{Y2}$ may be formed between the second plurality of stacked conductive layers 242a and an adjacent memory cell (e.g., in the Y-direction).

The partial removal of the first conductive material layer 301, second conductive material layer 302 and third conductive material layer 303 illustrated in FIG. 2R may be performed, for example, by etching using a photolithographic process that may include forming a patterned photoresist mask on the third conductive material layer 303 and etching back (e.g., wet etching, dry etching, etc.) the first conductive material layer 301, second conductive material layer 302 and third conductive material layer 303. This may complete the formation of the first plurality of stacked conductive layers 142a on one side of the inner trench portion 113a, and the formation of the second plurality of stacked conductive layers 242a on the opposing side of the inner trench portion 113a.

FIG. 2S provides a perspective view and cross-sectional view along the cross-section S-S' of the first semiconductor device 100 and second semiconductor device 200, according to one or more embodiments. FIG. 2S illustrates the forming by blanket deposition of the capacitor dielectric on the conductive layers of each of the first trench capacitor portion 141 and first stacked capacitor portion 142 (e.g., see FIG. 1A), and each of the second trench capacitor portion 241 and the second stacked capacitor portion 242 (e.g., see FIG. 2A). In particular, FIG. 2S illustrates the forming of first upper dielectric layer 142b on the first plurality of stacked conductive layers 142a, and the forming of the second upper dielectric layer 242b on the second plurality of stacked conductive layers 242a. FIG. 2S also illustrates the forming of the first lower dielectric layer 141b on the first lower conductive layer 141a, and the forming of the second lower dielectric layer 241b on the second lower conductive layer 241a. As illustrated in FIG. 2S, the dielectric material may be blanket-deposited over the isolation layer 130 so as to form a blanket dielectric layer 342 on the isolation layer 130 around a perimeter of the first stacked capacitor portion 142 and the second stacked capacitor portion 242. In addition, the dielectric material may be formed on the upper surface of the isolation layer 130 at the bottom of the inner trench portion 113a so as to connect the first lower dielectric layer 141b and second lower dielectric layer 241b.

The forming of the first upper dielectric layer 142b, first lower dielectric layer 141b, second upper dielectric layer 242b, and second lower dielectric layer 241b FIG. 2T provides a perspective view and cross-sectional view along the cross-section T-T' of the first semiconductor device 100 and second semiconductor device 200, according to one or more embodiments. FIG. 2T illustrates the forming (e.g., by deposition) of a conductive material (e.g., TiN or TaN) that constitutes the top electrode 145 on the capacitor dielectric outside the trench and inside the trench so as to fill the remaining inside of the trench. In particular, FIG. 2T illustrates the forming of the lower top electrode portion 145a that is formed in the inner trench portion 113a, and the forming of the upper top electrode portion 145b that is formed over the first stacked capacitor portion 142 and second stacked capacitor portion 242, and between the first plurality of stacked conductive layers 142a in the first stacked capacitor portion 142 and between the second plurality of stacked conductive layers 242a in the second stacked capacitor portion 242. The top electrode portion 145b may also be formed in the gaps GX, GY1 and GY2 and on the regions 130a, 130b and 130c of the isolation layer 130 that are illustrated in FIG. 2R. The top electrode portion 145b may also be formed on the blanket dielectric layer 342 around a perimeter of the first stacked capacitor portion 142 and the second stacked capacitor portion 242. The conductive material of the top electrode 145 may include, for example, TiN or TaN, and may be deposited, for example, by chemical vapor deposition (CVD), plasma-enhanced CVD (PECVD), low pressure chemical vapor deposition (LPCVD), physical vapor deposition (PVD) or atomic layer deposition (ALD).

Figure 3:
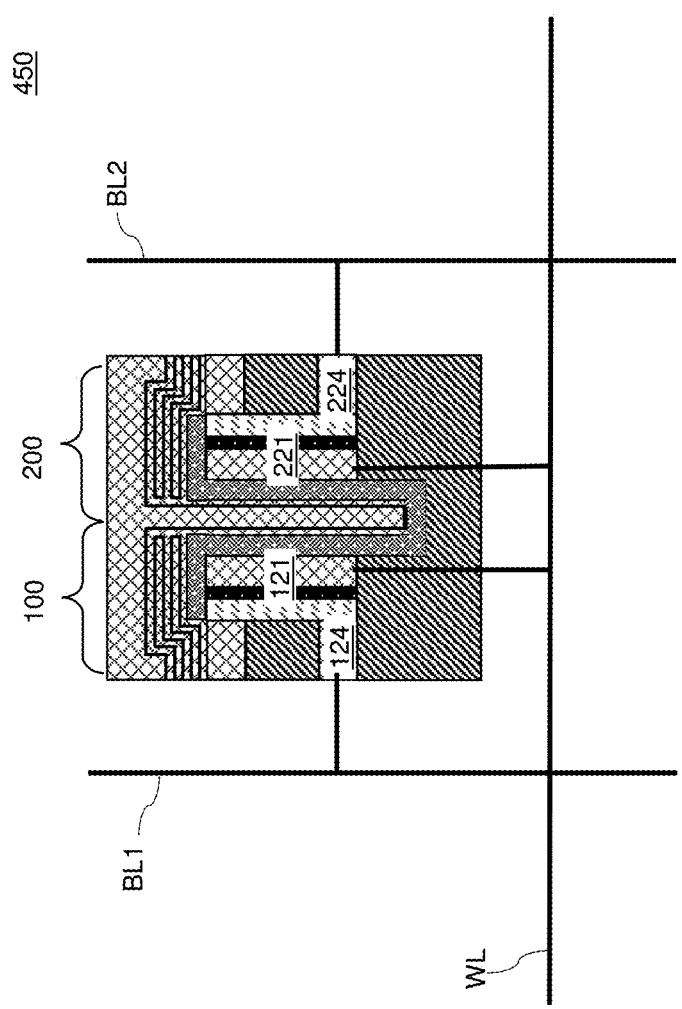
FIG. 3 is a schematic drawing of a DRAM device including a vertical cross-sectional view of a first semiconductor device (e.g., first memory cell) and a second semiconductor device (e.g., second memory cell) according to one or more embodiments.

FIG. 3 is a schematic drawing of a DRAM device 450 including a vertical cross-sectional view of a first semiconductor device 100 (e.g., first memory cell) and a second semiconductor device 200 (e.g., second memory cell) according to one or more embodiments. In the DRAM device 450, the first semiconductor device 100 (e.g., first DRAM memory cell) may include an integrated first capacitor 140 and first transistor 120 (e.g., see FIGS. 1A-1C). The first gate electrode 121 of first transistor 120 may be connected to the word line WL and the first drain electrode 124 of the first transistor 120 may be connected to the bit line BL1. The second semiconductor device 200 (e.g., second DRAM memory cell) may include an integrated second capacitor 240 and second transistor 220 (e.g., see FIGS. 1A-1C). The second gate electrode 221 of the second transistor 220 may be connected to the word line WL and the second drain electrode 224 of the second transistor 220 may be connected to the bit line BL2.

Figure 4:
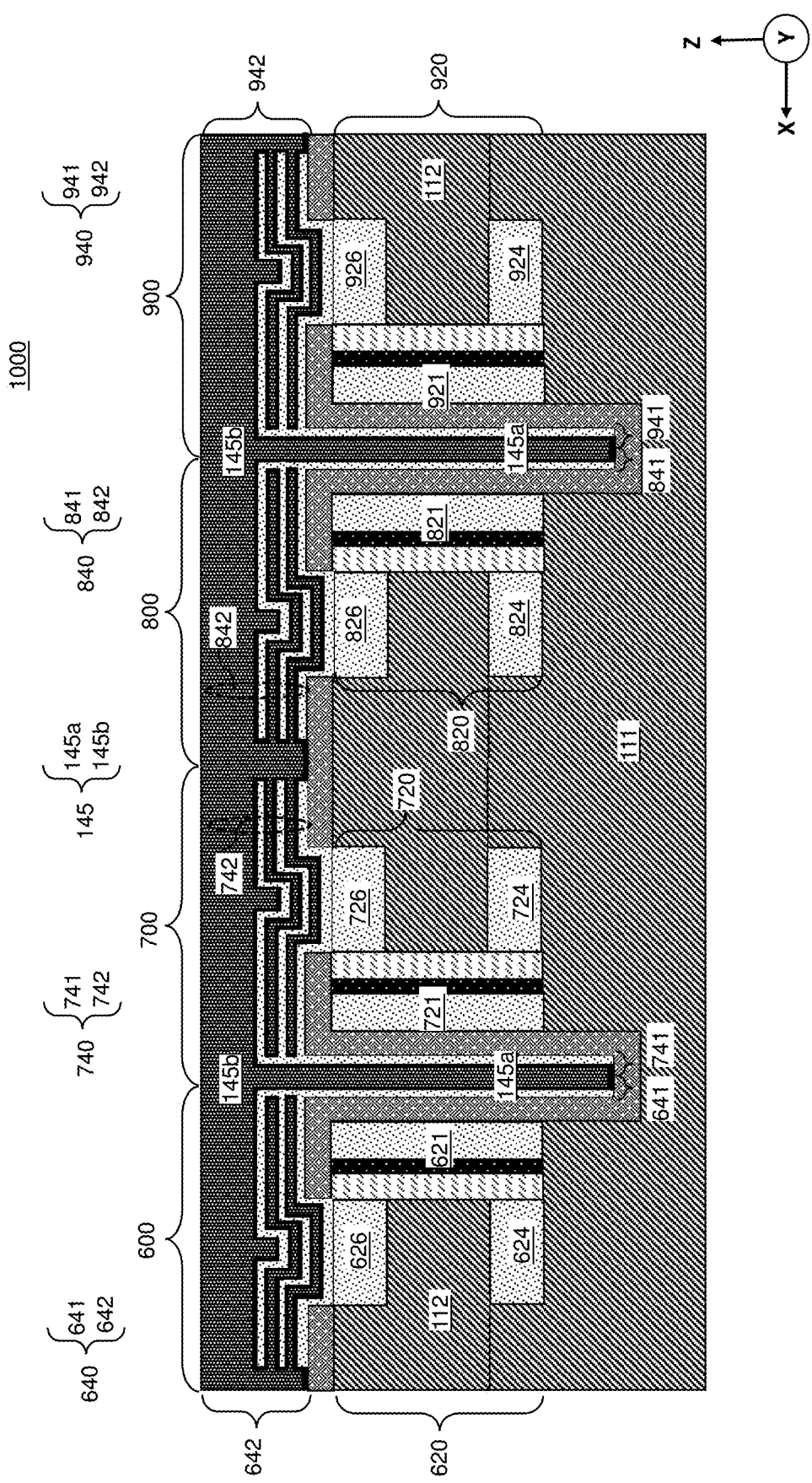
FIG. 4 illustrates an alternative embodiment including four semiconductor devices that are adjacent in the X-direction, according to one or more embodiments.

FIG. 4 illustrates a DRAM device 1000 including four semiconductor devices (e.g., four memory cells) that are adjacent in the X-direction, according to one or more embodiments. As illustrated in FIG. 4, the DRAM device 1000 may include a sixth semiconductor device 600, seventh semiconductor device 700, eighth semiconductor device 800 and ninth semiconductor device 900, all of which may be formed in the lower insulating layer 111 and upper insulating layer 112. The sixth semiconductor device 600 (e.g., sixth memory cell) may include a sixth transistor 620 that may include a sixth gate electrode, a sixth drain electrode 624 and sixth source electrode 626. The sixth semiconductor device 600 may also include a sixth capacitor 640 including a sixth trench capacitor portion 641 and a sixth stacked capacitor portion 642. The seventh semiconductor device 700 (e.g., seventh memory cell) may include a seventh transistor 720 that may include a seventh gate electrode, a seventh drain electrode 724 and seventh source electrode 726. The seventh semiconductor device 700 may also include a seventh capacitor 740 including a seventh trench capacitor portion 741 and a seventh stacked capacitor portion 742. The eighth semiconductor device 800 (e.g., eighth memory cell) may include a eighth transistor 820 that may include a eighth gate electrode, a eighth drain electrode 824 and eighth source electrode 826. The eighth semiconductor device 800 may also include a eighth capacitor 840 including a eighth trench capacitor portion 841 and a eighth stacked capacitor portion 842. The ninth semiconductor device 900 (e.g., ninth memory cell) may include a ninth transistor 920 that may include a ninth gate electrode, a ninth drain electrode 924 and ninth source electrode 926. The ninth semiconductor device 900 may also include a ninth capacitor 940 including a ninth trench capacitor portion 941 and a ninth stacked capacitor portion 942.

It should be noted that the top electrode 145 including the lower top electrode portion 145a and upper top electrode portion 145b, may be included in each of the sixth semiconductor device 600, seventh semiconductor device 700, eighth semiconductor device 800 and ninth semiconductor device 900. In addition, the top electrode 145 may include a conductive material that is different from a conductive material in the transistors and capacitors. That is, the top electrode 145 may include a conductive material that is different from a conductive material in the sixth transistor 620 and sixth capacitor 640, different from a conductive material in the seventh transistor 720 and seventh capacitor 740, different from a conductive material in the eighth transistor 820 and eighth capacitor 840, and different from a conductive material in the ninth transistor 920 and ninth capacitor 940. For example, the conductive material may be TiN in the top electrode 145, whereas the conductive material may be TaN in the sixth transistor 620 (e.g., the sixth gate electrode 621, sixth drain electrode 624 and sixth source electrode 626) and sixth capacitor 640 (e.g., sixth trench capacitor portion 641 and sixth stacked capacitor portion 642), seventh transistor 720 (e.g., the seventh gate electrode 721, seventh drain electrode 724 and seventh source electrode 726) and seventh capacitor 740 (e.g., seventh trench capacitor portion 741 and seventh stacked capacitor portion 742), the eighth transistor 820 (e.g., the eighth gate electrode 821, eighth drain electrode 824 and eighth source electrode 826) and eighth capacitor 840 (e.g., eighth trench capacitor portion 841 and eighth stacked capacitor portion 842), and the ninth transistor 920 (e.g., the ninth gate electrode 921, ninth drain electrode 924 and ninth source electrode 926) and ninth capacitor 940 (e.g., ninth trench capacitor portion 941 and ninth stacked capacitor portion 942).

Figure 5:
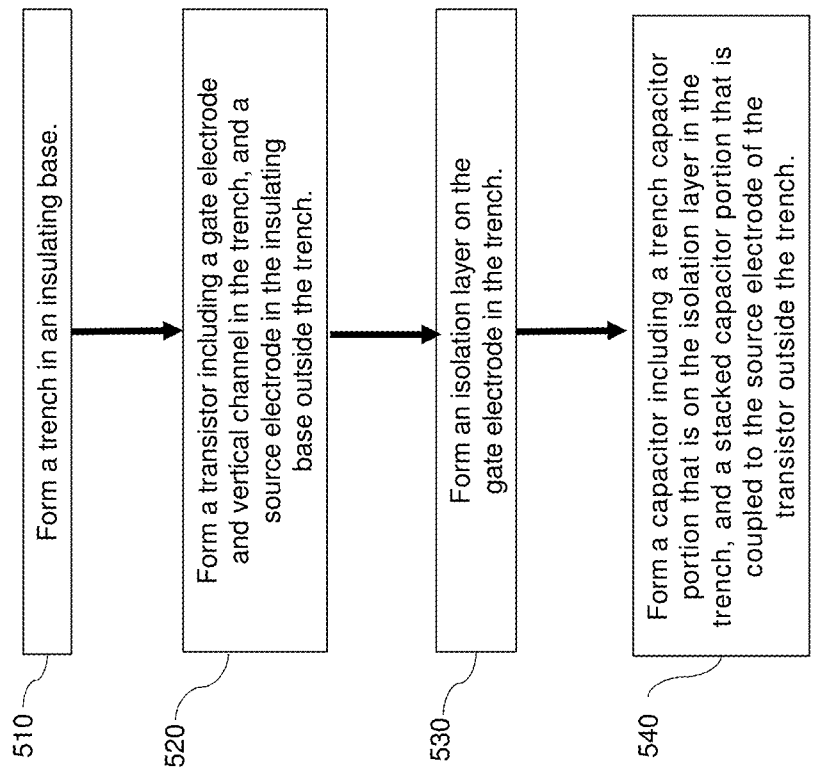
FIG. 5 is a flow chart illustrating the method steps included in a method of forming a semiconductor device (e.g., first semiconductor device and/or second semiconductor device) according to one or more embodiments.

FIG. 5 illustrates a method of forming a semiconductor device (e.g., first semiconductor device 100 and/or second semiconductor device 200), according to one or more embodiments. The method may include Step 510 of forming a trench in an insulating base, Step 520 of forming a transistor including a gate electrode and a vertical channel in the trench, and a source electrode in the insulating base outside the trench, Step 530 of forming an isolation layer on the gate electrode in the trench, and a Step 540 of forming a capacitor including a trench capacitor portion that is on the isolation layer in the trench, and a stacked capacitor portion that is coupled to the source electrode of the transistor outside the trench.

Referring collectively to FIGS. 1A-4, and according to various embodiments of the present disclosure, a semiconductor device 100, 200 may be provided. The semiconductor device 100, 200 may include an insulating base 110 including a trench 113, a transistor 120, 220 including a gate electrode 121, 221 and vertical channel 123, 223 in the trench 113, and a drain electrode and a source electrode 126, 226, an isolation layer 130 on the gate electrode 121, 221 in the trench 113, and a capacitor 140, 240 including a trench capacitor portion 141, 241 that is on the isolation layer 130 in the trench 113, and a stacked capacitor portion 142, 242 that is coupled to the source electrode 126, 226 of the transistor 120, 220 outside the trench 113.

In an embodiment, the trench capacitor portion 141, 241 may include a lower conductive layer 141a, 241a on the isolation layer 130, and the stacked capacitor portion 142, 242 may include a plurality of stacked conductive layers 142a, 242a that are coupled to the source electrode 126, 226. In an embodiment, the lower conductive layer 141a, 241a may extend outside the trench 113 and may be connected to the plurality of stacked conductive layers 142a, 242a. In an embodiment, the trench capacitor portion 141, 241 may further include a lower dielectric layer 141b, 241b on the lower conductive layer 141a, 241a in the trench 113. In an embodiment, the stacked capacitor portion 142, 242 may further include an upper dielectric layer 142b, 242b on the plurality of stacked conductive layers 142a, 242a, and the lower dielectric layer 141b, 241b may extend outside the trench 113 and may be connected to the upper dielectric layer 142b, 242b. In an embodiment, the capacitor 140, 240 may further include a top electrode 145 including a lower top electrode portion 145a on the lower dielectric layer 141b, 241b in the trench 113 and an upper top electrode portion 145b on the upper dielectric layer 142b, 242b outside the trench 113. In an embodiment, the isolation layer 130 may be on a bottom of the trench 113 and the lower dielectric layer 141b, 241b may be on an upper surface of the isolation layer 130 at the bottom of the trench 113, and the lower conductive layer 141a, 241a may include a terminal portion that may contact the upper surface of the isolation layer 130 at the bottom of the trench 113. In an embodiment, the vertical channel 123, 223 may be on a sidewall of the trench 113, and the transistor 120, 220 may further include a gate dielectric 122, 222 between the vertical channel 123, 223 and the gate electrode 121, 221 in the trench 113. In an embodiment, the transistor 120, 220 may further include a drain electrode 124, 224, and the vertical channel 123, 223 may extend upward along the sidewall of the trench 113 from the drain electrode 124, 224 to the source electrode 126, 226.

Referring to all drawings, a method of forming a semiconductor device 100, 200 is provided. The method of forming a semiconductor device 100, 200 may include forming a trench 113 in an insulating base 110, forming a transistor 120, 220 including a gate electrode 121, 221 and vertical channel 123, 223 in the trench 113, a drain electrode 124, 224 and a source electrode 126, 226 outside the trench 113, forming an isolation layer 130 on the gate electrode 121, 221 in the trench 113, forming a capacitor including a trench capacitor portion 141, 241 that is on the isolation layer 130 in the trench 113, and a stacked capacitor portion 142, 242 that is coupled to the source electrode 126, 226 of the transistor 120, 220 outside the trench 113.

In an embodiment, the forming of the capacitor 140, 240 may include forming a lower conductive layer 141a, 241a on the isolation layer 130 in the trench 113, and forming a plurality of stacked conductive layers 142a, 242a outside the trench 113, the plurality of stacked conductive layers 142a, 242a being coupled to the source electrode 126, 226 of the transistor 120, 220. In an embodiment, the forming of the capacitor 140 may further include forming a lower dielectric layer 141b, 241b on the lower conductive layer 141a, 241a in the trench 113, and forming an upper dielectric layer 142b, 242b on the plurality of stacked conductive layers 142a, 242a. In an embodiment, the forming of the lower dielectric layer 141b, 241b may include forming the lower dielectric layer 141b, 241b outside the trench 113 and connected to the upper dielectric layer 142b, 242b. In an embodiment, the forming of the capacitor 140, 240 may include forming a top electrode 145 including a lower top electrode portion 145a formed on the lower dielectric layer 141b, 241b in the trench 113, and an upper top electrode portion 145b formed on the upper dielectric layer 142b, 242b outside the trench 113. In an embodiment, the forming of the isolation layer 130 may include forming the isolation layer 130 on a bottom of the trench 113, and the forming of the lower dielectric layer 141b, 241b may include forming the lower dielectric layer 141b, 241b on an upper surface of the isolation layer 130 at the bottom of the trench 113, and the forming of the lower conductive layer 141a, 241a may include forming a terminal portion of the lower conductive layer 141a, 241a that contacts the upper surface of the isolation layer 130 at the bottom of the trench 113. In an embodiment, the forming of the isolation layer 130 may include forming the isolation layer 130 on an upper surface of the gate electrode 121, 221 such that the isolation layer 130 isolates the gate electrode 121, 221 from the stacked capacitor portion. In an embodiment, the forming of the transistor may further include forming a drain electrode 124, 224 in the insulating base 110 outside the trench 113. In an embodiment, the method may further include forming the vertical channel 123, 223 on a sidewall of the trench 113, the vertical channel 123, 223 extending upward along the sidewall of the trench 113 from the drain electrode 124, 224 to the source electrode 126, 226, and forming a gate dielectric 122, 222 on the vertical channel 123, 223 in the trench 113.

In some embodiments, a dynamic random access memory (DRAM) device may include an insulating base 110 including a trench 113, a first memory cell 100 including a first transistor 120 in the trench 113, and a first capacitor 140 including a first trench capacitor portion 141 including a first lower conductive layer 141a in the trench 113, a first stacked capacitor portion 142 including a first plurality of stacked conductive layers 142a outside the trench 113, a second memory cell 200 including a second transistor 220 in the trench 113, and a second capacitor 240 including a second trench capacitor portion 241 including a second lower conductive layer 241a in the trench 113, and a second stacked capacitor portion 242 including a second plurality of stacked conductive layers 242a formed outside the trench 113, and an isolation layer 130 in the trench 113 and isolating the first memory cell 100 from the second memory cell 200. The DRAM device may further include a first bit line BL1 coupled to a first drain electrode 224 of the first transistor 120 in the first memory cell 100, a second bit line BL2 coupled to a second drain electrode 224 of the second transistor 220 in the second memory cell 200, and a word line WL coupled to a first gate electrode 121 of the first transistor 120 in the first memory cell 100, and a second gate electrode 221 of the second transistor 220 in the second memory cell 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an insulating base including a trench;
a transistor comprising a gate electrode, a vertical channel in the trench, a drain electrode and a source electrode;
an isolation layer on the gate electrode in the trench; and
a capacitor comprising:
a trench capacitor portion comprising a lower conductive layer, wherein the trench capacitor portion is on the isolation layer formed within the trench; and
a stacked capacitor portion comprising a plurality of stacked conductive layers, wherein the stacked capacitor portion is coupled to the source electrode of the transistor formed outside the trench.

2. The semiconductor device of claim 1, wherein the lower conductive layer extends outside the trench and is connected to the plurality of stacked conductive layers.

3. The semiconductor device of claim 1, wherein the trench capacitor portion further comprises a lower dielectric layer on the lower conductive layer in the trench.

4. The semiconductor device of claim 3, wherein the stacked capacitor portion further comprises an upper dielectric layer on the plurality of stacked conductive layers, and
wherein the lower dielectric layer extends outside the trench and is connected to the upper dielectric layer.

5. The semiconductor device of claim 4, wherein the capacitor further comprises a top electrode including a lower top electrode portion on the lower dielectric layer in the trench and an upper top electrode portion on the upper dielectric layer outside the trench.

6. The semiconductor device of claim 3, wherein the isolation layer is on a bottom of the trench and the lower dielectric layer is on an upper surface of the isolation layer at the bottom of the trench, and the lower conductive layer comprises a terminal portion that contacts the upper surface of the isolation layer at the bottom of the trench.

7. The semiconductor device of claim 1, wherein the vertical channel is on a sidewall of the trench, and the transistor further comprises a gate dielectric between the vertical channel and the gate electrode in the trench.

8. The semiconductor device of claim 7, wherein the vertical channel extends upward along the sidewall of the trench from the drain electrode to the source electrode.

9. A method of forming a semiconductor device, comprising:
forming a trench in an insulating base;
forming a transistor, wherein the transistor comprises a gate electrode and a vertical channel formed within the trench, and a drain electrode and a source electrode formed outside the trench;
forming an isolation layer on the gate electrode in the trench; and
forming a capacitor including a trench capacitor portion that is on the isolation layer in the trench, and a stacked capacitor portion that is coupled to the source electrode of the transistor outside the trench, wherein the forming of the capacitor comprises:
forming a lower conductive layer on the isolation layer in the trench; and
forming a plurality of stacked conductive layers outside the trench, the plurality of stacked conductive layers being coupled to the source electrode of the transistor.

10. The method of claim 9, wherein the forming of the capacitor further comprises forming a lower dielectric layer on the lower conductive layer in the trench, and forming an upper dielectric layer on the plurality of stacked conductive layers.

11. The method of claim 10, wherein the forming of the lower dielectric layer comprises forming the lower dielectric layer outside the trench and connected to the upper dielectric layer.

12. The method of claim 11, wherein the forming of the capacitor further comprises forming a top electrode including a lower top electrode portion formed on the lower dielectric layer in the trench, and an upper top electrode portion formed on the upper dielectric layer outside the trench.

13. The method of claim 10, wherein the forming of the isolation layer comprises forming the isolation layer on a bottom of the trench, and
wherein the forming of the lower dielectric layer comprises forming the lower dielectric layer on an upper surface of the isolation layer at the bottom of the trench, and the forming of the lower conductive layer comprises forming a terminal portion of the lower conductive layer that contacts the upper surface of the isolation layer at the bottom of the trench.

14. The method of claim 9, wherein the forming of the isolation layer comprises forming the isolation layer on an upper surface of the gate electrode such that the isolation layer isolates the gate electrode from the stacked capacitor portion.

15. The method of claim 9, wherein the forming of the transistor comprises forming the drain electrode in the insulating base outside the trench.

16. The method of claim 15, wherein the forming of the transistor further comprises:
forming the vertical channel on a sidewall of the trench, the vertical channel extending upward along the sidewall of the trench from the drain electrode to the source electrode; and
forming a gate dielectric on the vertical channel in the trench.

17. A dynamic random access memory (DRAM) device comprising:
an insulating base including a trench;
a first memory cell comprising:
a first transistor formed within the trench; and
a first capacitor comprising:
a first trench capacitor portion including a first lower conductive layer formed within the trench;
a first stacked capacitor portion including a first plurality of stacked conductive layers formed outside the trench;
a second memory cell comprising:
a second transistor formed within the trench; and
a second capacitor comprising:
a second trench capacitor portion including a second lower conductive layer formed within the trench; and
a second stacked capacitor portion including a second plurality of stacked conductive layers formed outside the trench; and
an isolation layer formed within the trench and isolating the first memory cell from the second memory cell.

18. The DRAM device of claim 17, further comprising:
a first bit line coupled to a first drain electrode of the first transistor in the first memory cell;
a second bit line coupled to a second drain electrode of the second transistor in the second memory cell; and
a word line coupled to a first gate electrode of the first transistor in the first memory cell, and a second gate electrode of the second transistor in the second memory cell.

* * * * *